United States Patent
Nakasaka et al.

(10) Patent No.: US 8,724,313 B2
(45) Date of Patent: May 13, 2014

(54) POWER CONVERSION APPARATUS

(75) Inventors: Akira Nakasaka, Anjo (JP); Satoshi Noda, Kariya (JP); Kenichi Oohama, Ichinomiya (JP)

(73) Assignee: Denso Corporation, Kariya (JP)

( * ) Notice: Subject to any disclaimer, the term of this patent is extended or adjusted under 35 U.S.C. 154(b) by 33 days.

(21) Appl. No.: 13/021,948

(22) Filed: Feb. 7, 2011

(65) Prior Publication Data
US 2011/0194246 A1 Aug. 11, 2011

(30) Foreign Application Priority Data

Feb. 5, 2010 (JP) ................................ 2010-024557
Oct. 29, 2010 (JP) ................................ 2010-244597

(51) Int. Cl.
*H05K 7/20* (2006.01)

(52) U.S. Cl.
USPC ...... 361/679.46; 361/688; 361/715; 361/763; 361/831; 363/141; 62/259.2

(58) Field of Classification Search
USPC ............. 361/679.46–679.47, 679.52–679.54, 361/688–690, 698–704, 707, 715–718, 725, 361/728, 763–764, 821, 829–832
See application file for complete search history.

(56) References Cited

U.S. PATENT DOCUMENTS

| | | | | |
|---|---|---|---|---|
| 5,258,888 A | * | 11/1993 | Korinsky | 361/704 |
| 5,497,289 A | * | 3/1996 | Sugishima et al. | 361/709 |
| 5,631,821 A | * | 5/1997 | Muso | 363/141 |
| 6,166,937 A | * | 12/2000 | Yamamura et al. | 363/141 |
| 7,248,478 B2 | * | 7/2007 | Inoue | 361/699 |
| 7,542,318 B2 | | 6/2009 | Otsuka et al. | |
| 7,663,886 B2 | | 2/2010 | Aoki et al. | |
| 8,149,577 B2 | * | 4/2012 | Tang et al. | 361/688 |
| 8,189,324 B2 | | 5/2012 | Folts | |
| 8,213,179 B2 | | 7/2012 | Yoshida et al. | |
| 2003/0133319 A1 | | 7/2003 | Radosevich et al. | |
| 2006/0096299 A1 | * | 5/2006 | Mamitsu et al. | 62/3.2 |

(Continued)

FOREIGN PATENT DOCUMENTS

| | | |
|---|---|---|
| CN | 1906840 | 1/2007 |
| JP | 2002-043782 | 2/2002 |

(Continued)

OTHER PUBLICATIONS

Nakasaka et al, U.S. Appl. No. 13/021,926, filed Feb. 7, 2011.

(Continued)

*Primary Examiner* — Courtney Smith
(74) *Attorney, Agent, or Firm* — Nixon & Vanderhye P.C.

(57) ABSTRACT

An electric power conversion apparatus is provided which includes electronic components, a cooler, an internal unit, a capacitor, and a case. The internal unit has a frame to which at least one of the electronic components and the cooler are secured and which surrounds all around the one of the electronic components. The frame includes unit fixing sections through which the internal unit is fixed to the case and capacitor fixing sections through which the capacitor is fixed to the internal unit. The capacitor fixing sections are located inward of the frame more than the unit fixing sections. The internal unit is fixed to the case and thus works as a beam to increase the mechanical rigidity of the case. The fixing of the internal unit to the case minimizes external force to be exerted through the case on the electronic component and the cooler.

5 Claims, 26 Drawing Sheets

(56) References Cited

U.S. PATENT DOCUMENTS

| | | |
|---|---|---|
| 2006/0232939 A1 | 10/2006 | Inoue |
| 2006/0243422 A1 | 11/2006 | Sakai et al. |
| 2007/0002594 A1 | 1/2007 | Otsuka et al. |
| 2007/0076355 A1 | 4/2007 | Oohama |
| 2007/0165376 A1* | 7/2007 | Bones et al. ............ 361/688 |
| 2007/0215316 A1* | 9/2007 | Saito et al. ............ 165/41 |
| 2007/0295715 A1 | 12/2007 | Saka et al. |
| 2008/0158824 A1 | 7/2008 | Aoki et al. |
| 2008/0205107 A1 | 8/2008 | Hattori et al. |
| 2009/0040724 A1 | 2/2009 | Nishikimi et al. |
| 2009/0241575 A1 | 10/2009 | Jadric et al. |
| 2009/0251859 A1 | 10/2009 | Harada et al. |
| 2009/0273916 A1 | 11/2009 | Hironaka |
| 2010/0091464 A1* | 4/2010 | Ohnishi et al. ............ 361/723 |
| 2011/0194247 A1 | 8/2011 | Nakasaka et al. |
| 2011/0194248 A1 | 8/2011 | Nakasaka et al. |
| 2011/0194249 A1 | 8/2011 | Nakasaka et al. |
| 2011/0194322 A1 | 8/2011 | Nakasaka et al. |
| 2012/0039039 A1 | 2/2012 | Nishikimi et al. |
| 2012/0170217 A1 | 7/2012 | Nishikimi et al. |

FOREIGN PATENT DOCUMENTS

| | | |
|---|---|---|
| JP | 2005-516570 | 6/2005 |
| JP | P2006-174572 A | 6/2006 |
| JP | P2007-014085 A | 1/2007 |
| JP | P2007-036214 A | 2/2007 |
| JP | 2007-220794 | 8/2007 |
| JP | P2008-166358 A | 7/2008 |
| JP | 2008-215089 | 9/2008 |
| JP | 4225310 | 12/2008 |
| JP | 2009-044891 | 2/2009 |
| JP | 2009-130964 | 6/2009 |
| JP | 2009-159767 | 7/2009 |
| JP | 2009-261125 | 11/2009 |
| JP | P2009-266986 A | 11/2009 |
| JP | P2010-010505 A | 1/2010 |

OTHER PUBLICATIONS

Nakasaka et al, U.S. Appl. No. 13/021,931, filed Feb. 7, 2011.
Nakasaka et al, U.S. Appl. No. 13/021,934, filed Feb. 7, 2011.
Nakasaka et al, U.S. Appl. No. 13/021,937, filed Feb. 7, 2011.
Japanese Office Action dated Jan. 10, 2012, issued in corresponding Japanese Application No. 2010-244594, with English translation.
Japanese Office Action dated Jun. 26, 2012, issued in corresponding Japanese Application No. 2010-244592, with English translation.
Japanese Office Action dated Jun. 26, 2012, issued in corresponding Japanese Application No. 2010-244595, with English translation.
Official Action dated Aug. 6, 2012, issued in copending U.S. Appl. No. 13/021,934 of Nakasaka, filed Feb. 7, 2011.
Office Action (10 pages) dated Dec. 10, 2012 in related U.S. Appl. No. 13/021,926.
Office Action issued in Chinese Patent Appl. 201110036400.4 on Mar. 18, 2013 along with English Language Translation.
Office Action issued in Japanese Patent Appl. No. 2010-244595 on Jan. 8, 2013, with an English Language Translation.
Office Action issued on Mar. 28, 2013 in co-pending U.S. Appl. No. 13/021,937.
Office Action issued in Japanese Patent Appl 2010-244595 dated Jul. 9, 2013 with English Language Translation of thereof.
Office Action (2 pages) dated Jan. 8, 2013 issued in corresponding Japanese Application No. 2010-244592 and English translation (2 pages).
Official Action (13 pages) dated Jan. 31, 2013, issued in copending U.S. Appl. No. 13/021,931 of Nakasaka, filed Feb. 7, 2011.
Official Action (7 pages) dated Feb. 7, 2013, issued in copending U.S. Appl. No. 13/021,934 of Nakasaka, filed Feb. 7, 2011.

* cited by examiner

POWER CONVERSION APPARATUS

CROSS REFERENCE TO RELATED DOCUMENT

The present application claims benefits of priority of Japanese Patent Application No. 2010-244597 filed on Oct. 29, 2010 and Japanese Patent Application No. 2010-24557 filed on Feb. 5, 2010, the disclosures of which are incorporated herein by reference.

BACKGROUND OF THE INVENTION

1. Technical Field of the Invention

The present invention relates generally to a power conversion apparatus in which electronic components constituting a power conversion circuit and a cooler for cooling at least some of the electronic components are disposed in a case.

2. Background Art

An electric vehicle or a hybrid vehicle is equipped with a power conversion apparatus such as an inverter or a converter to convert source power into driving power for a drive motor. As shown in FIG. 27, such a power conversion apparatus 9 includes various electronic components including semiconductor modules 921 each incorporating therein switching elements, and a capacitor 922. For example, refer to Japanese patent Application Laid-Open No. 2009-159767. To prevent the temperature of the semiconductor modules 921 from increasing excessively, a cooler 93 is disposed in contact with the semiconductor modules 921.

The power conversion apparatus 9 further includes a control circuit board 96 on which a control circuit for controlling the semiconductor modules 921 is formed. The electronic components including the semiconductor modules 921, the cooler 93 and the control circuit board 96 are fixed to a case 94, and sealingly enclosed within the case 94.

Accordingly, if the case 94 is not rigid enough, the electronic components and the control circuit board 96 fixed to the case 94 may vibrate considerably, causing wire breakage, or failure in the electronic components due to external force applied thereto.

When the power conversion apparatus 9 is located in an engine compartment of a vehicle, the case 94 may expand or contract considerably due to abrupt temperature change. In this case, since the components are fixed directly to the case 94, they may fail due to thermal stress applied to them.

The case 94 of the power conversion apparatus 9 is constituted of a case body 940, and bottom and top lids 941 and 942. Accordingly, the case 94 has two large sealing surfaces required to be water-tight. Accordingly, since the case 94 has to be provided with many sealing members, the power conversion apparatus 9 is disadvantageous in the manufacturing cost.

In addition, the maintainability of the power conversion apparatus 9 is not good enough in this case, because both the bottom lid 941 and the top lid 942 have to be removed for maintenance work. It might be possible that the case 94 has only one sealing surface, if the case 94 is constituted of a bottomed case body and a top lid. However, in this case, the maintainability and rigidity of the case 94 may become worse.

Further, since vibration of the electronic components directly fixed to the case 94 can transmit to a vehicle body through the case 94, unpleasant vibration sound may occur in the vehicle cabin. Conversely, since vibration of the engine can transmit to the electronic components and the control circuit board through the case 94, wire breakage or fault may occur.

The power conversion apparatus 9 has the electronic component such as the capacitor 922 affixed directly to the case 94, thus increasing difficult in assembling the power conversion apparatus 9 and resulting in an increase in production cost thereof.

SUMMARY OF THE INVENTION

It is therefore a principal object of the invention to avoid the disadvantages of the prior art.

It is another object of the invention to provide an improved structure of a power conversion apparatus which is equipped with a high-rigidity case and designed to minimize external force acting on electronic components, to be easy in assemble, to be excellent in maintenance, and to be produced at low costs.

According to one aspect of the invention, there is provided a power conversion apparatus which comprises: (a) electronic components constituting a power conversion circuit; (b) a cooler which works to cool at least a portion of the electronic components; (c) an internal unit having a frame to which the at least the portion of the electronic components and the cooler are secured and which surrounds all around the at least the portion of the electronic components; (d) a case in and to which the internal unit is disposed and fixed through the frame; and (e) a capacitor that is one of the electronic components and with which the internal unit is equipped. The frame includes unit fixing sections through which the internal unit is fixed to the case and capacitor fixing sections through which the capacitor is fixed to the internal unit. The capacitor fixing sections are located inward of the frame more than the unit fixing sections.

Specifically, at least one of the electronic components and the cooler are fixed to the frame. The at least one of the electronic component, the cooler, and the frame are assembled as the internal unit. The internal unit is secured to and disposed inside the case. The internal unit, therefore, works as a beam which increases the mechanical rigidity of the case without having to increase the thickness of the case itself and form a reinforcement rib on the case. This also permits material or production costs or weight of the case to be reduced.

The fixing of the internal unit to the case minimizes external force or pressure to be exerted through the case on the electronic component and the cooler in the internal unit, in other words, decreases vibrational or thermal effects on the electronic component and the cooler in the internal unit.

The assembling of the power conversion apparatus may be achieved by installing the electronic component on the frame to complete the internal unit and then putting the internal unit in the case, thus resulting in ease of producing the power conversion apparatus. The internal unit may be taken out of the case for maintenance thereof, thus resulting in improved maintenance workability. This also eliminates the need for the case to have a plurality of lids or doors, which permits a sealing surface between the case and a lid to be one in number. This improves the water tightness of the case, and reduces the sealing material of the case, to thereby reduce the material cost and man-hour cost for application of the sealing material to the case.

The internal unit is secured to the case through the frame. The frame, thus, works as a beam to enhance the mechanical rigidity of the case.

The frame is shaped to surround all around the electronic component, thereby shielding electromagnetic noise emitted from the electronic component. The case is sometimes made of a conductive material. The electromagnetic noise emitted from the electronic component is shielded doubly by the frame and the case.

The internal unit is equipped with the capacitor as one of the electronic components, thereby reducing external pressure to be exerted on the capacitor and mechanical vibration to be transmitted from the capacitor to the case. This minimizes transmission of undesirable noise arising from the vibration of the capacitor to, for example, inside a cabin of an automotive vehicle in which the power conversion apparatus is installed.

The frame includes unit fixing sections through which the internal unit is fixed to the case and capacitor fixing sections through which the capacitor is fixed to the internal unit. The capacitor fixing sections are located inward of the frame more than the unit fixing sections, thus permitting the unit fixing sections to be positioned outside the capacitor when the internal unit made by mounting the capacitor on the frame is secured to the case. This minimizes the possibility of physical interference of the capacitor with the case when the internal unit is mounted within the case.

The ends of the frame may be an antinode of vibration, so that the amplitude of vibration thereof will be great, while the center of the frame may be a node of vibration, so that the amplitude of vibration will be small. The amplitude of vibration of the capacitor fixing sections is, therefore, decreased by locating the capacitor fixing sections closer to the center of the frame than the unit fixing sections. This minimizes the transmission of vibration to the capacitor, thus resulting in a decreased possibility of malfunction of the capacitor.

In the preferred mode of the invention, the internal unit may have a plurality of semiconductor modules disposed inside the frame as ones of the electronic components. The semiconductor modules have switching elements installed therein. The semiconductor modes are each equipped with a main electrode terminal into or from which controlled electric power is inputted or outputted and which protrudes toward the capacitor. The capacitor fixing sections protrude from the frame toward the capacitor to have a top end located farther away from the frame than a top end of the main electrode terminal.

The above structure provides the power conversion apparatus which has enhanced heat and vibration resistances and is easy to assemble. Specifically, the main electrode terminals project toward the capacitor. If, therefore, top ends 971 of main electrode terminals 970, as illustrated in FIG. 28, are located farther from a frame 980 than top ends 961 of capacitor fixing sections 960, it will result in physical interference of the main electrode terminals 970 with a capacitor 922 unless protrusions 923 such as bosses are provided on the capacitor 922. The outer shell of the capacitor 922 is usually made of resin. The protrusions 923, thus, must be made of resin, so that it will susceptible to mechanical vibration or thermal stress. The top ends of the main electrode terminals of the semiconductor modules are, as described above, located closer to the frame than the top ends of the capacitor fixing sections, thus enabling the capacitor to be joined to the capacitor fixing sections without having to form any protrusions on the capacitor. The capacitor fixing sections may be made of metal like the frame and thus insusceptible to the vibration or thermal stress.

The internal unit incorporates therein a stacked body in which coolant passages and the semiconductor modules are stacked alternately. The frame includes a front wall section and a rear wall section which are located on sides of the frame in a stacking direction in which the coolant passages and the semiconductor modules are stacked and a pair of side wall sections joining the front and rear wall sections at ends thereof. This structure results in a decrease in external force or pressure to be exerted on the semiconductor modules with the switching elements susceptible to the external force, thereby improving the durability of the power conversion apparatus. The structure also permits the stacked body to be assembled outside the case, thus facilitating the ease of producing the power conversion apparatus. The stacked body is made of the coolant passages and the semiconductor modules which are stacked alternately, thus resulting in enhanced efficiency in cooling the semiconductor modules and also permitting the stacked body to be compact in size.

The frame includes the front wall section, the rear wall section, and the side wall sections joining the front and rear wall sections. The stacked body is retained by the front wall section, thus facilitating the retaining of the stacked body through the frame.

The internal unit is equipped with bus bars which have input/output terminals into or from which controlled electric power is input or outputted. The input/output terminals extend perpendicular to the side wall sections. The capacitor fixing sections are located in the stacking direction outward of two of side surfaces of the capacitor which extend in parallel to each other and perpendicular to the stacking direction. This permits the power conversion apparatus to be reduced in size. Specifically, the capacitor fixing sections are usually made of metal like the frame. The input/output terminals are usually subjected to high-voltage. It is, thus, necessary to place the capacitor fixing sections and the input/output terminals away from each other in order to ensure electric insulation therebetween. If capacitor fixing sections 957 are, as illustrated in FIG. 29, located inward of side surfaces 929a and 929b in the stacking direction X which are two of side surfaces 929 of a capacitor 922 and extend parallel to each other in the lateral direction Y, it will result in a decreased minimum distance d between input/output terminals 999 and the capacitor fixing sections 957. The distance d, therefore, has to be increased in order to ensure a required degree of the insulation between the input/output terminals 999 and the capacitor fixing sections 957, which will result in an increase in overall size of the power conversion apparatus. The power conversion apparatus of this invention, as described above, may be designed to have the capacitor fixing sections located outside the parallel extending side surfaces of the capacitor in the stacking direction, so that the capacitor fixing sections will be remote from the input/output terminals, thus eliminating the need for increasing the size of the frame and permitting the power conversion apparatus to be made compact in size.

The internal unit may be equipped with a pressure member which presses the stacked body in the stacking direction. The stacked body has a front end and a rear end which are opposite each other in the stacking direction. The pressure member is disposed between the rear end of the stacked body and the rear wall section. The front end of the stacked body is supported by the front wall section and has a coolant introduction tube through which coolant is introduced into the coolant passages and a coolant discharge tube from which the coolant is discharged from the coolant passages. The front wall section has formed therein recesses in which the coolant introduction tube and the coolant discharge tube are placed. The capacitor fixing sections protrude from the frame toward the capacitor and overlap at least partially with the recesses as viewed from a direction in which the capacitor fixing sections protrude. The reaction force of the pressure member is, therefore, absorbed by the frame. This eliminates the need for the case to have rigidity large enough to bear the reaction force of the pressure member or to include ribs, thus permitting the case to be light in weight and less expensive.

As viewed from the direction in which the capacitor fixing sections extend, the capacitor fixing sections at least partially overlap the recesses. This enhances the rigidity of the frame. Specifically, the formation of the recesses in the front wall section of the frame will result in a decrease in rigidity of the frame. The overlapping of the capacitor fixing sections with the recesses, however, compensates for such a lack of rigidity of the frame, thereby minimizing the deformation of the frame arising from exertion of physical pressure from the pressure member.

The frame, as described above, includes the plurality of unit fixing sections for fixing the internal unit to the case. At least one of the fixing sections may be located on the outside of each of two supports of the frame in the stacking direction where the frame is applied with the reaction force which is oriented outward in the stacking direction and exerted by the stacked body and the pressure member. This results in an increase in rigidity of the frame through the case against the reaction force exerted by the stacked body and the pressure member. In other words, the case serves to reinforce the frame, thereby avoiding the undesirable deformation of the frame arising from the reaction force.

The frame may have the front wall section and the rear wall section located at ends of the stacked body which are opposite to each other in the stacking direction and also have the side wall sections connecting the front wall section and the rear wall section together at ends of the side wall sections. This ensures the stability in retaining the stacked body inside the frame.

The wall thickness of the front wall section and the rear wall section are preferably larger than the wall thickness of the side wall section. This improves the rigidity of the front and rear wall sections subjected to the reaction force of the pressure member and also allows the side wall sections not subjected directly to the reaction force of the pressure member to be reduced in weight. This also permits the frame to be light in weight and ensures the frame to have rigidity large enough to resist the reaction force of the pressure member.

At least a portion of each of the front and rear wall sections may form an H-shaped wall section having a roughly H-shaped cross section. The H-shaped wall section is constituted of a pair of longitudinal plate sections perpendicular to the stacking direction and a connecting section connecting these longitudinal plate sections together. This permits the frame to be made light in weight and ensures the high rigidity of the front and rear wall sections.

At least a part of each of the side wall sections may form an L-shaped wall section having a roughly L-shaped cross section. The L-shaped wall section is constituted of a main wall having a major surface facing the inner surface of the frame and an inward portion projecting toward the inner side of the frame from one end of the main wall portion in the direction perpendicular to the stacking direction. This permits the side wall sections to be reduced in weight and their material cost to be decreased without sacrificing the rigidity thereof.

The cooler may includes cooling tubes each of which defines therein one of the coolant passages. Each of the cooling tubes has a length. The cooling tubes may be joined at ends opposite to each other in the lengthwise direction of the cooling tubes. The semiconductor modules may each have the main electrode terminal into or from which the controlled power is inputted or outputted and the control terminal into which controlled current to control operation of the switching elements. The main electrode terminal and the control terminal extend in opposite directions (i.e., height directions of the frame) which are perpendicular to the stacking direction and the longitudinal direction of the cooling tubes. The frame may be shaped to open both in the height directions, which facilitates the installation of bus bars or a control circuit board on the semiconductor modules.

The internal unit may include a control circuit board on which a control circuit for controlling the switching elements included in the semiconductor modules is formed. It is not necessary to secure the control circuit board directly to the case, thus facilitating the ease of installing the control circuit board in the internal unit and also minimizing the degree of external force acting on the control circuit board.

The frame may also include unit fixing sections through which the internal unit is secured to the case. The unit fixing sections are preferably located outside an outer edge of the control circuit board. This facilitates the ease of installing the internal unit in the case. Specifically, if the unit fixing sections are located inward of an outer edge of the control circuit board, the internal unit assembled with the control circuit board cannot be easily fixed to the case. In this case, to fix the internal unit to the case 4, it is necessary to drill holes penetrating the wall of the case through which bolts or the like are inserted in, for example. However, in this case, not only the workability is lowered, but also more sealing members have to be used to ensure the water tightness of the case. By locating the unit fixing sections outward of the outer edge of the control circuit board, such a problem will be alleviated.

The frame may be provided with board fixing sections for fixing the control circuit board to the internal unit, which are located more inward than the unit fixing sections. This facilitates the ease of installing the control circuit board on the frame and also placing the internal unit in the case.

The internal unit may include a terminal block on which input/output terminals for input and output of controlled electric power are mounted for making connection between the input/output terminals and external devices. This permits the terminal block to be installed in the internal unit outside the case, thus facilitating the ease of such installation.

The power conversion apparatus may be equipped with a plurality of bus bars which have the input/output terminals located at ends thereof. The power conversion apparatus may also include bus bar fixing sections for fixing the bus bars to the frame.

At least two of the bus bars may be partially molded with resin to form an integrated bus bar assembly. The frame may also include a plurality of bus bar fixing sections for fixing the bus bar assembly. At least two of the bus bar fixing sections are located closer to the terminal block than to the center of the frame. This ensures the stability in installing the bus bar assembly on the frame and also mounting the input/output terminals on the terminal block, thus assuring electric connections of the input/output terminals with external terminals.

The internal unit may be designed to have installed therein all the electronic components constituting the power conversion circuit, thereby protecting the electronic components from an external force and also facilitating the ease of manufacturing the power conversion apparatus and resulting in good maintainability of the electronic components.

The frame may also include a wire holding section through which a conductive wire is retained which has at least one of ends placed inside the case. The conductive wire may be so placed as to extend along the frame. This avoids the interference of the conductive wire with the internal unit when put in or taken out of the case.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
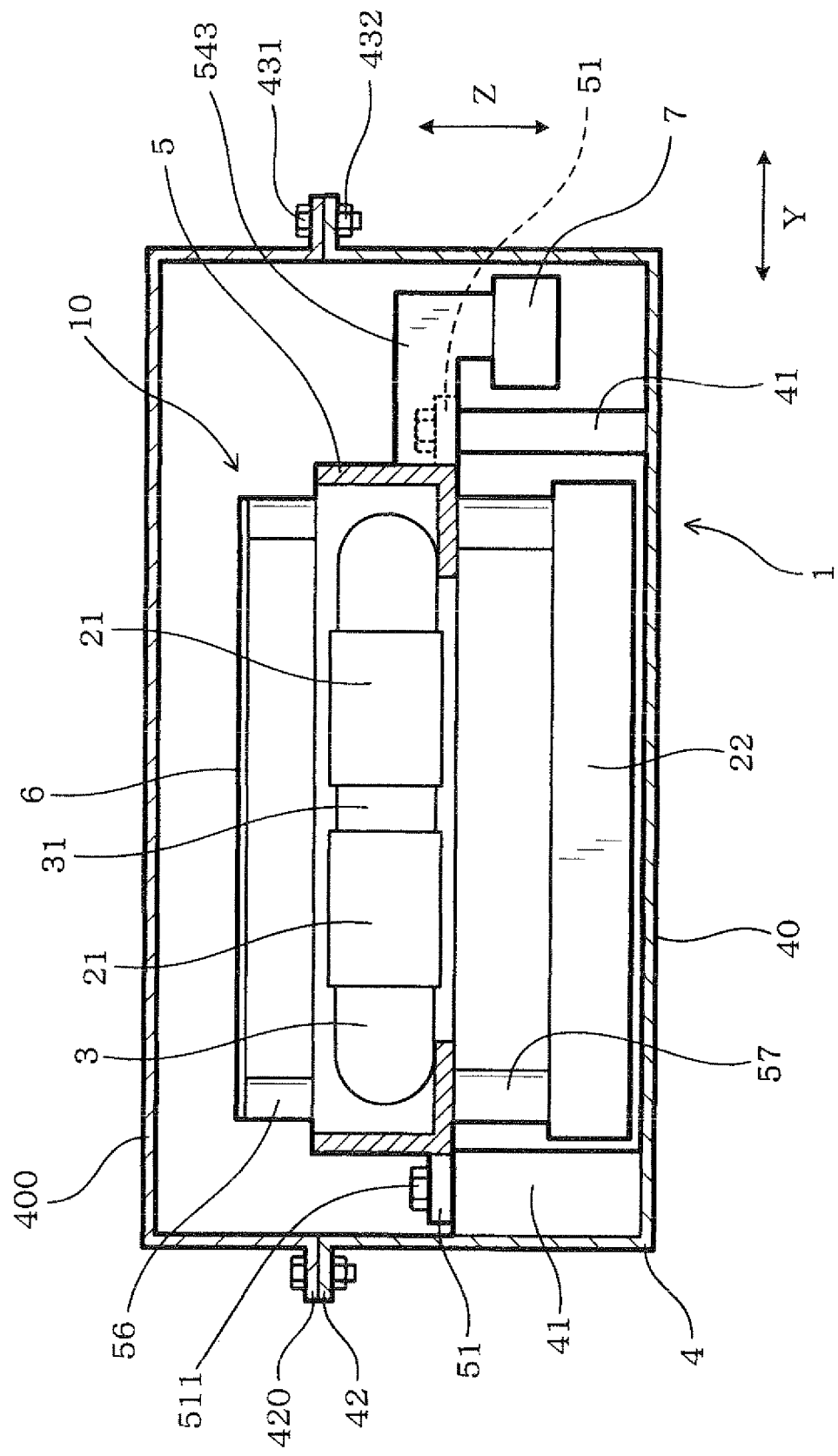
FIG. 1 is a schematic explanatory sectional view of a power conversion apparatus according to the first embodiment of the invention.

Referring to the drawings, wherein like reference numbers refer to like parts in several views, particularly to FIG. 1, there is shown an electric power conversion apparatus according to the first embodiment of the invention.

As shown in FIG. 1, the power conversion apparatus 1 of this embodiment is constituted of electronic components including semiconductor modules 21 and a capacitor 22, a cooler 3 for cooling at least some of the electronic components (the semiconductor modules 21 in this embodiment), and a case 4 housing the electronic components and the cooler 3. The semiconductor modules 21 and the cooler 3 are fixed to and integrated with a frame 5 to constitute an internal unit 10. The internal unit 10 is fixed to the case 4, and sealingly enclosed within the case 4.

Figure 16:
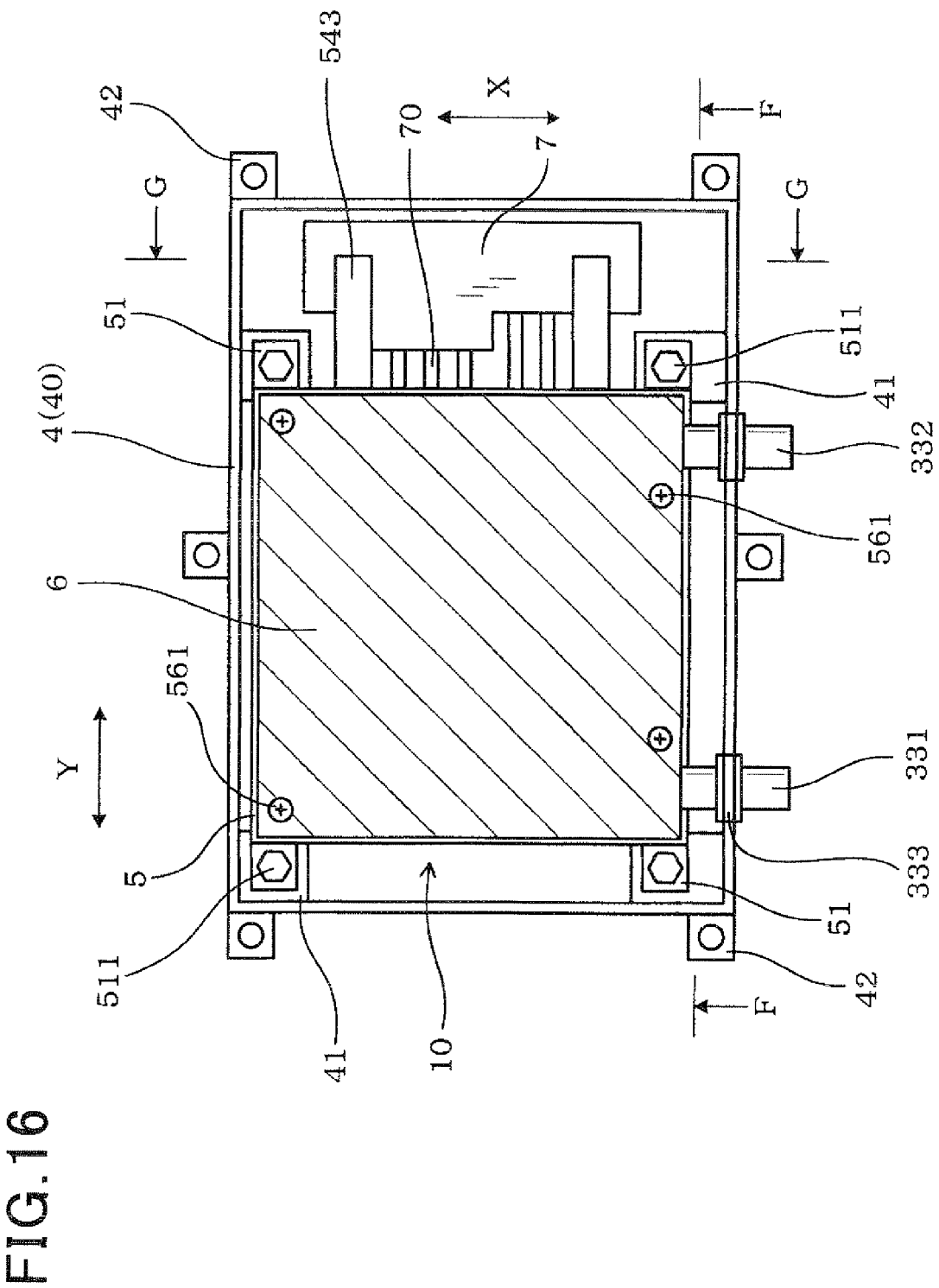
FIG. 16 is a plan view of an internal unit housed in a case of the first embodiment.
Figure 17:
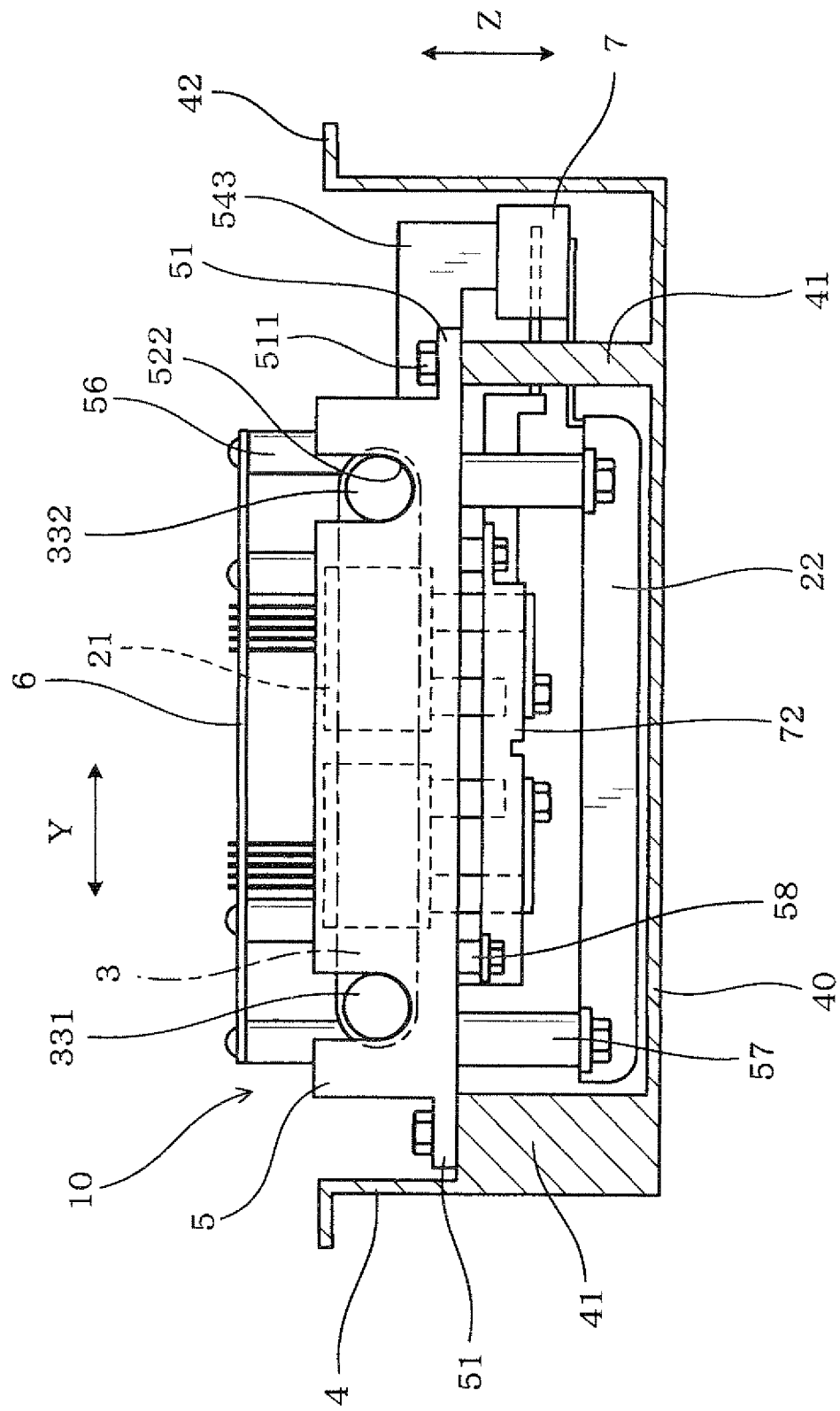
FIG. 17 is a cross-sectional view of FIG. 16 along the line F-F.
Figure 18:
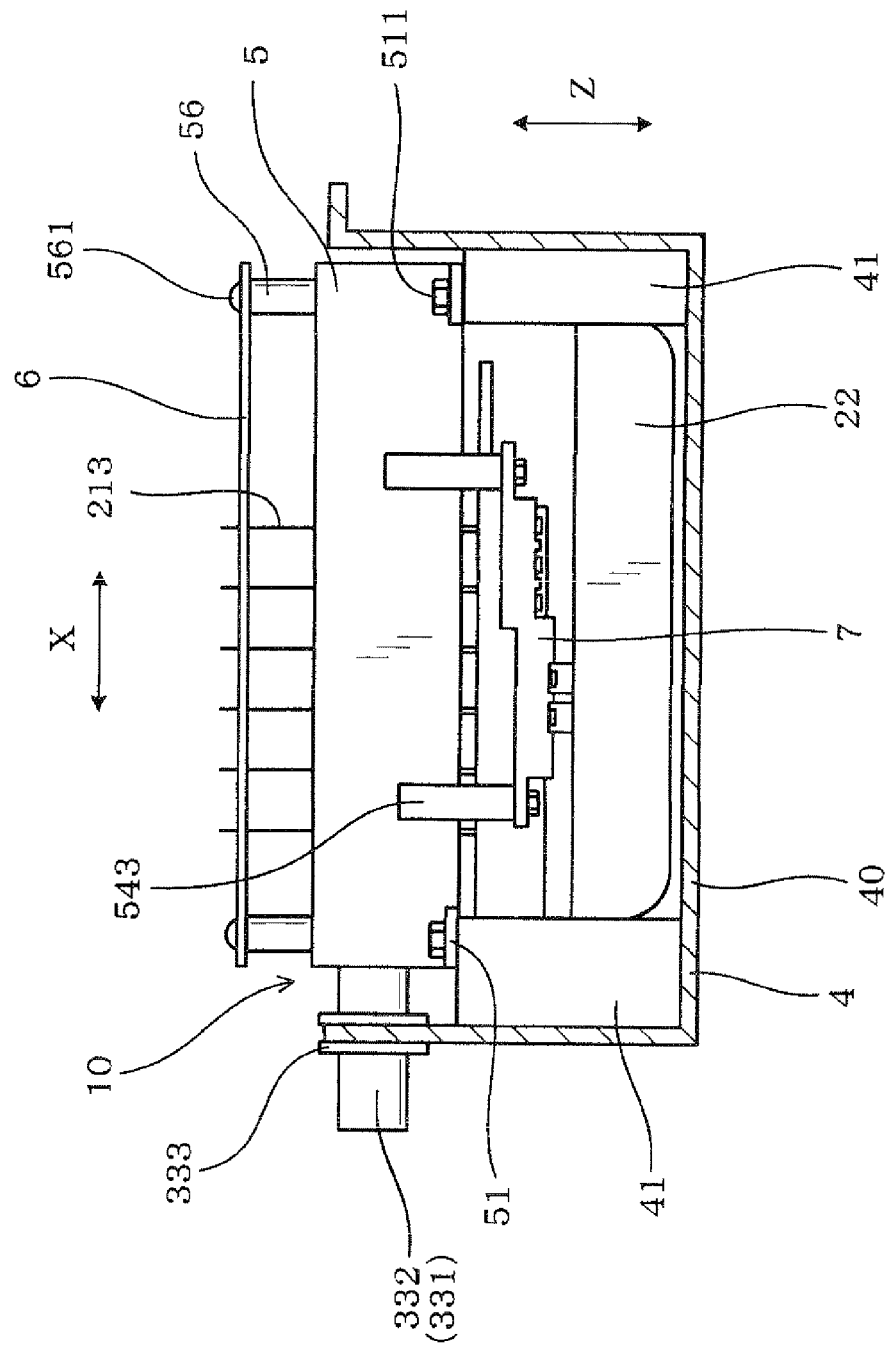
FIG. 18 is a cross-sectional view of FIG. 16 along the line G-G.

As shown in FIGS. 16 to 18, the internal unit 10 is fixed to the case 4 through the frame 5. The frame 5 is made of conductive material, and formed in a shape to surround the semiconductor modules 21 constituting the internal unit 10 from all four sides. The frame 5 may be a shaped body of metal such as aluminum or steel, or alloy. The case 4 may also be a shaped body of metal such as aluminum or steel or alloy.

Figure 14:
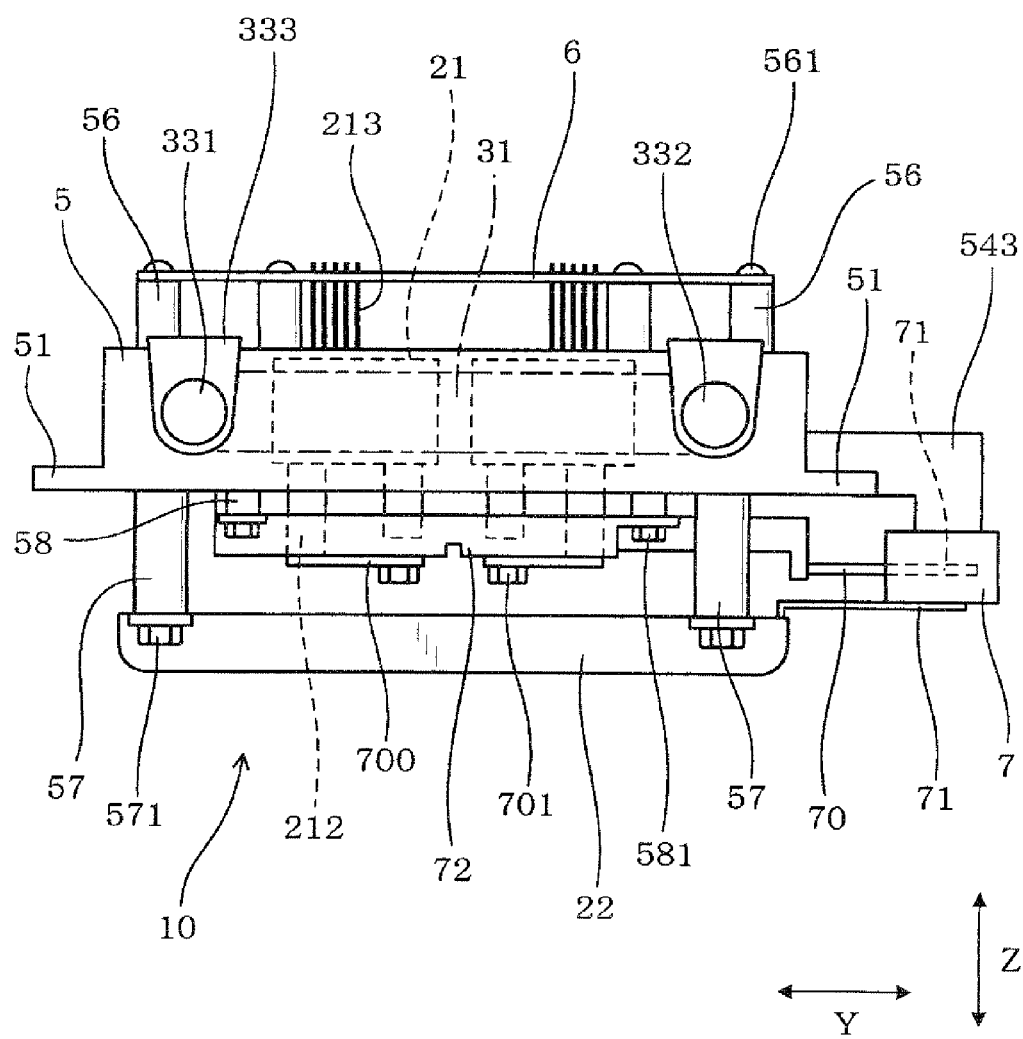
FIG. 14 is a front view of an internal unit of the first embodiment.
Figure 15:
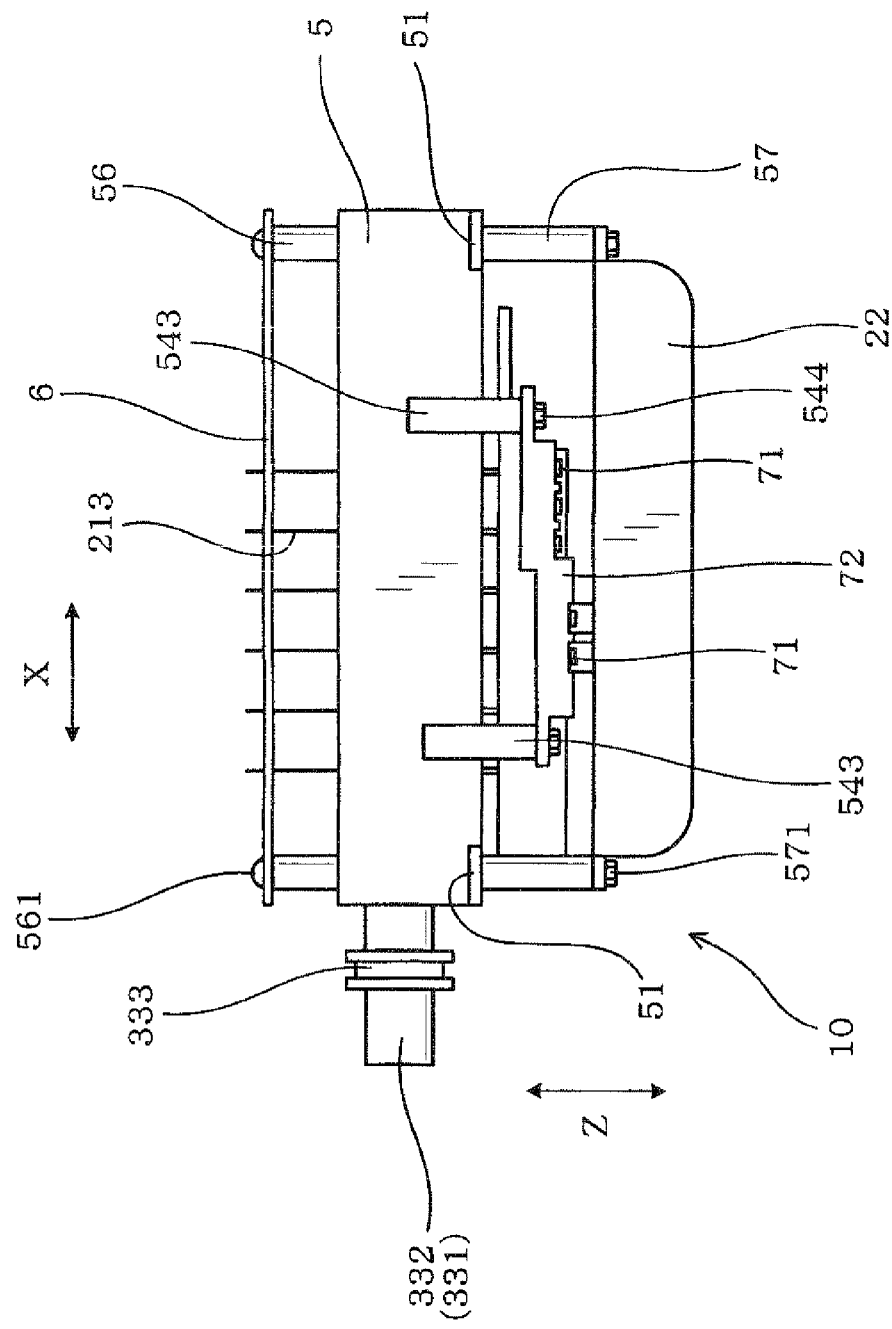
FIG. 15 is a side view of an internal unit of the first embodiment.

The internal unit 10 is, as illustrated in FIGS. 14 and 15, equipped with the capacitor 22 as one of the electronic components. The frame 5 has unit fixing sections 51 through which the internal unit 10 is secured to the case 4 and capacitor fixing sections 57 through which the capacitor 22 is retained by the internal unit 10. The capacitor fixing sections 57 are, as clearly illustrated in FIG. 3, located inward of the frame 5 than the unit fixing sections 51. In other words, the center of each of the capacitor fixing sections 57 lies within a quadrangle defined by line segments each of which extends between centers of adjacent two of the unit fixing sections 51.

Each of the semiconductor modules 21 incorporates therein switching elements such as IGBTs or MOSFETs. The semiconductor modules 21 are each constituted of a main body section 211 in which the switching elements are resin-molded, main electrode terminals 212 and control terminals 213. The main electrode terminals 212 and the control terminals 213 extend from the main body section 211 in the opposite directions. Controlled electric power is inputted to or outputted from each of the semiconductor modules 212 through the main electrode terminals 212. A control current to control the switching elements is inputted to each of the semiconductor modules 212 through the control terminals 213.

Figure 7:
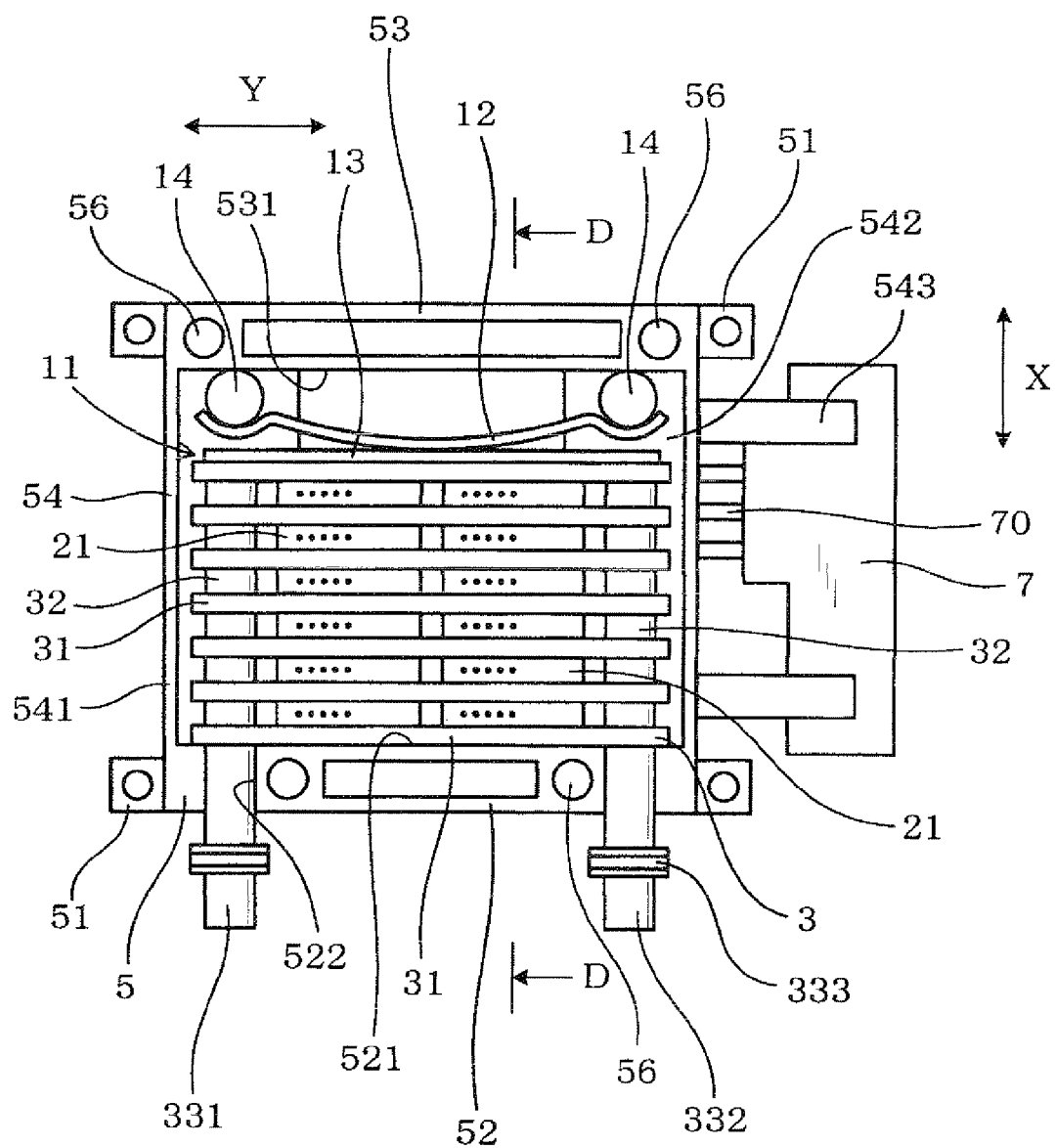
FIG. 7 is a plan view of a frame of the first embodiment on which a stacked body, a terminal block and so forth are installed.
Figure 10:
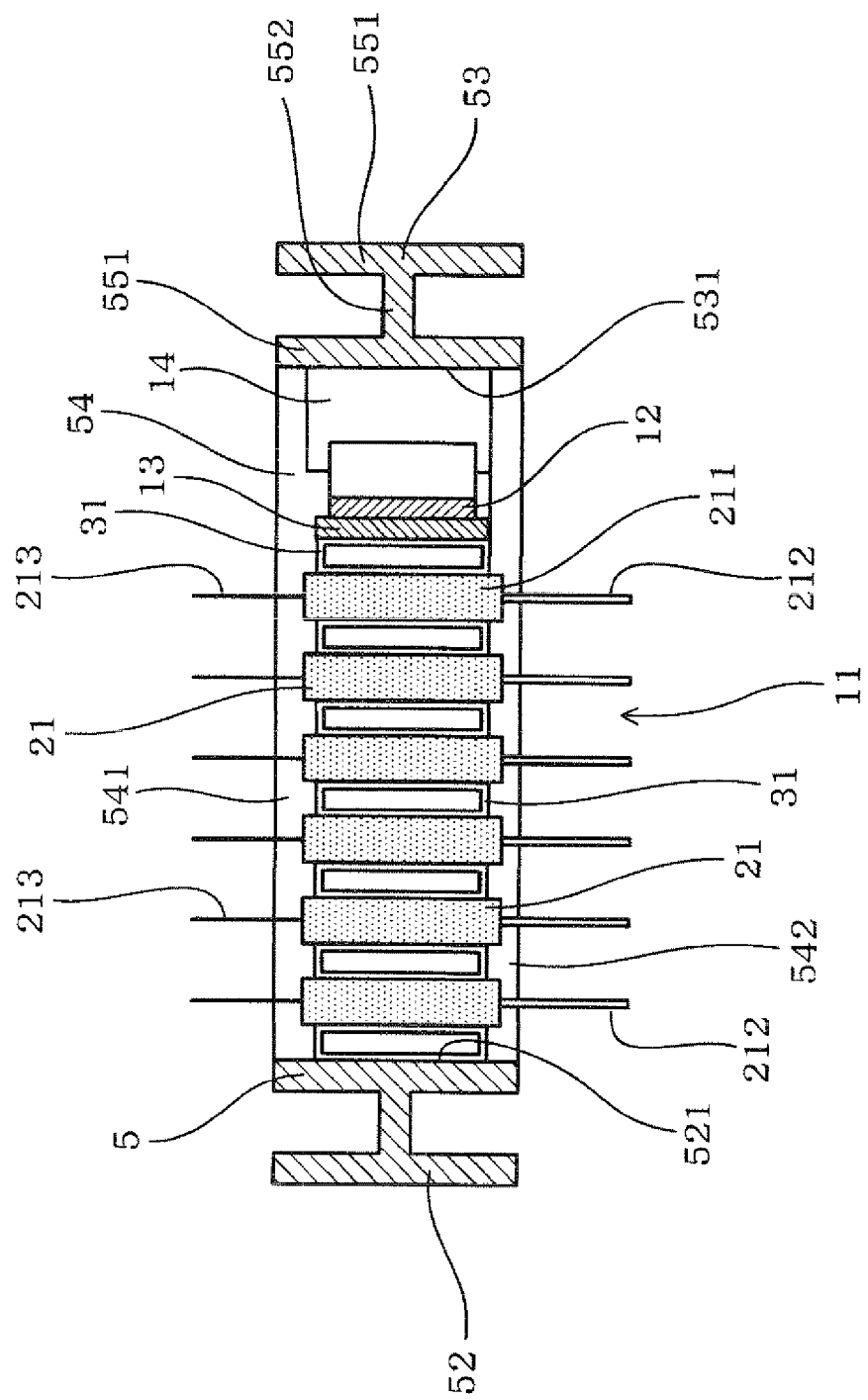
FIG. 10 is a cross-sectional view of FIG. 7 along the line D-D.

The cooler 3, as shown in FIGS. 7 and 10, includes cooling tubes 31 each having therein a coolant passage. The internal unit 10 incorporates therein a stacked body 11 in which the cooling tubes 31 and the semiconductor modules 21 are stacked alternately. Each of the semiconductor modules 21 is held between the cooling tubes 31 at both major surfaces thereof. Between each adjacent two of the cooling tubes 31, two semiconductor modules 21 are disposed.

The cooling tubes 31, as shown in FIG. 7, extend in their longitudinal direction (may be referred to as "the lateral direction Y") perpendicular to the stacking direction X. Each adjacent two of the cooling tubes 31 are joined through a deformable joint tube 32 at their both ends. The cooler 3 includes a coolant introduction tube 331 and a coolant discharge tube 332 which are joined to ends of one of the cooling tubes 31 which is located outermost of the stacked body 11 in the stacking direction X.

Accordingly, the coolant introduced from the coolant introduction tube 331 spreads in the longitudinal direction (lateral direction Y), while passing the joint tubes 32 to be distributed to the respective cooling tubes 31. The coolant exchanges heat with the semiconductor modules 21 while flowing through the respective cooling tubes 31. The coolant having a temperature increased by the heat exchange passes the joint tubes 32 on the downstream side, and is discharged from the coolant discharge tube 332.

As the coolant, there may be used a natural coolant such as water and ammonia, or water mixed with refrigerant such as ethylene glycol, or a fluorocarbon coolant such as fluorinert, or a chlorofluorocarbon coolant such as HCFC123 and HFC134a, or an alcoholic coolant such as methanol and alcohol, or a ketone coolant such as acetone.

The internal unit 10 includes a pressure member 12 for pressing the stacked body 11 in the stacking direction X. The pressure member 12 is interposed between an inner part of the frame 5 and one end of the stacked body 11 (this one end being referred to as "rear end" hereinafter) in the stacking direction X. The stacked body 11 is supported by another inner part of the frame 5 at the other end thereof (referred to as "front end" hereinafter).

The pressure member 12 is made by a leaf spring which bents convexly toward the stacked body 11. Between the pressure member 12 and the stacked body 11, a flat reinforcing plate 13 is interposed to prevent the pressing force of the pressure member 12 from being locally applied to the cooling tube 31 located at the rear end to thereby prevent this cooling tube 31 from being deformed. A support pin 14 is held between each of both ends of the pressure member 12 in the lateral direction Y and the frame 5. The pressure member 12 is supported by the pair of the support pins 14 at its rear side.

The frame 5 includes a front wall section 52 and a rear wall section 53 located on both sides of the stacked body 11 which are opposite each other in the stacking direction X, and a pair of side wall sections 54 joining the front and rear wall sections 52 and 53 at their both ends. Hence, as shown in FIGS. 2 and 3, the frame 5 has a substantially rectangular shape when viewed from the direction perpendicular to both the stacking direction X and the lateral direction Y (referred to as "height direction Z" hereinafter).

As show in FIGS. 1 to 3 and 19, the frame 5 includes unit fixing sections 51 for fixing the internal unit 10 to the case 4. At least one fixing section 54 is located on the outside of each of a pair of support sections (the inner surface 521 of the front wall section 52 and the inner surface 531 of the rear wall section 53) in the stacking direction X at which the frame 5 is applied with the reaction force toward the outside in the stacking direction X applied from the stacked body 11 and the pressure member 11. In this embodiment, two unit fixing sections 51 are located on the outside of the inner surface 521, and another two fixing sections 54 are located on the outside of the inner surface 531.

Each unit fixing section 51 is shaped to project outward from the frame 5 and is formed with a through hole. By inserting a bolt 511 into the through hole, and screwing the bolt 511 into a threaded hole formed in a corresponding one of unit support sections 41 formed inside the case 4 for each of the unit fixing sections 41, the frame 5 can be fixed to the case 4 to thereby fix the internal unit 10 to the case 4.

Figure 2:
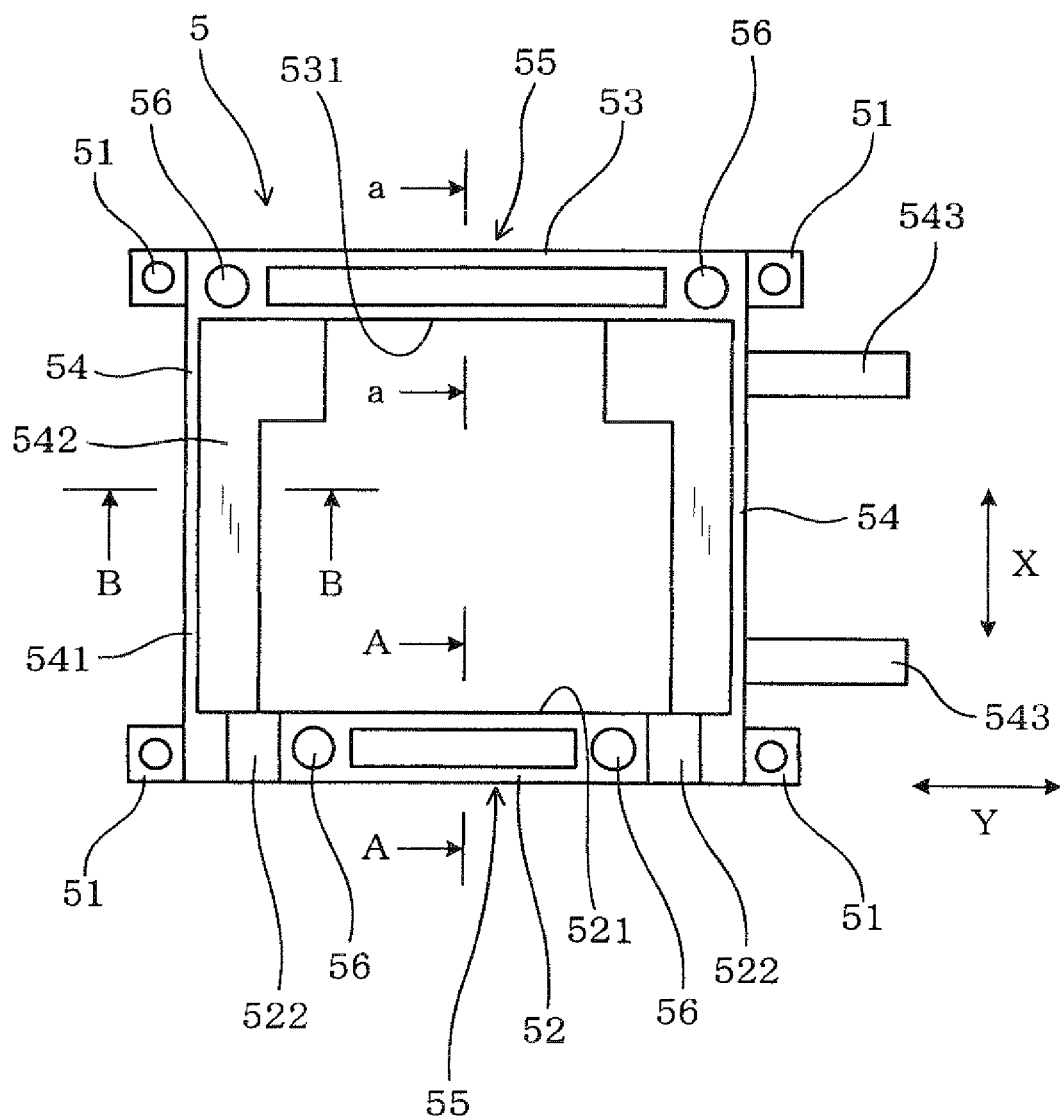
FIG. 2 is a plan view of a frame of the power conversion apparatus of FIG. 1.
Figure 3:
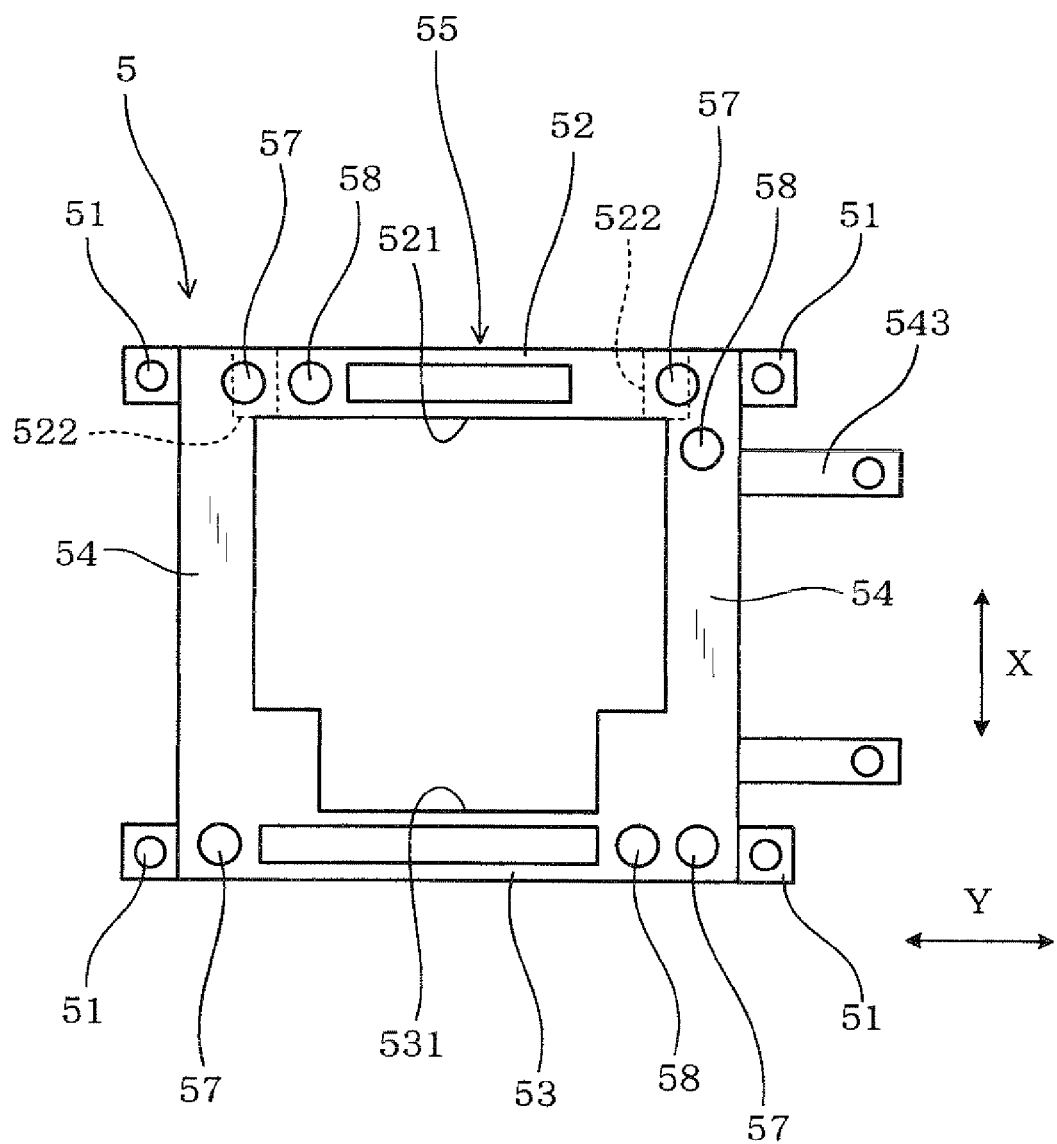
FIG. 3 is a bottom view of the frame shown in FIG. 2.
Figure 4:
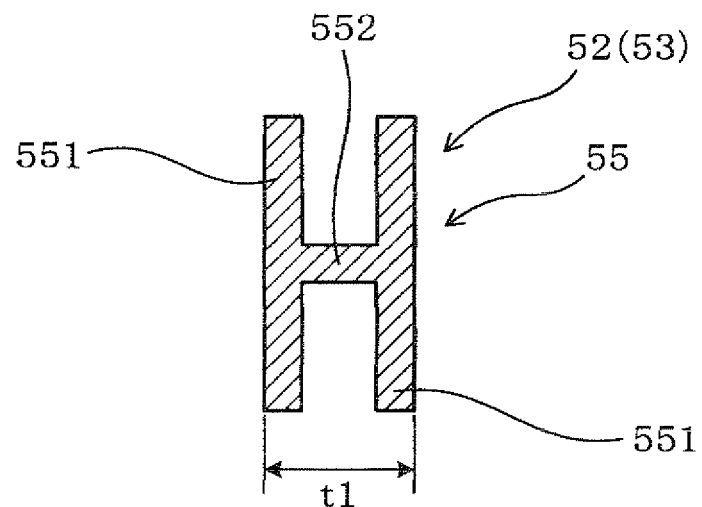
FIG. 4 is a cross-sectional view of FIG. 2 along the line A-A (or a-a)
Figure 5:
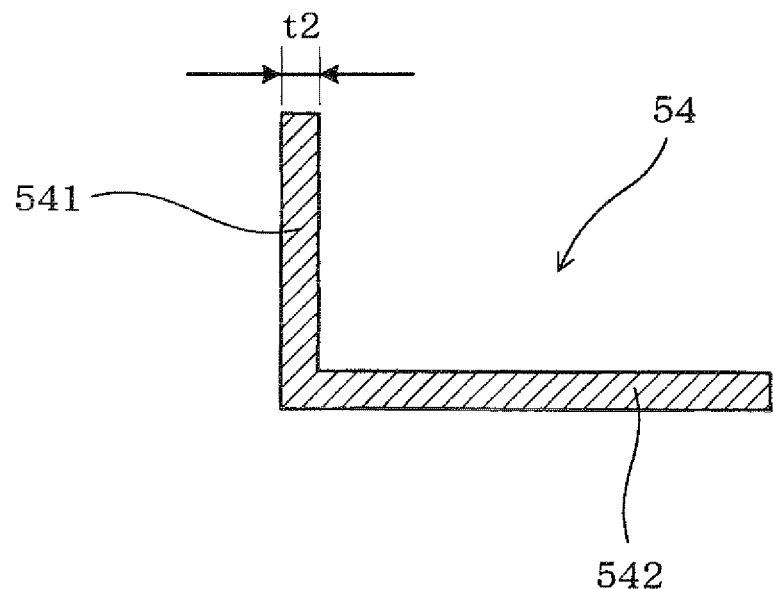
FIG. 5 is a cross-sectional view of FIG. 2 along the line B-B.
Figure 6:
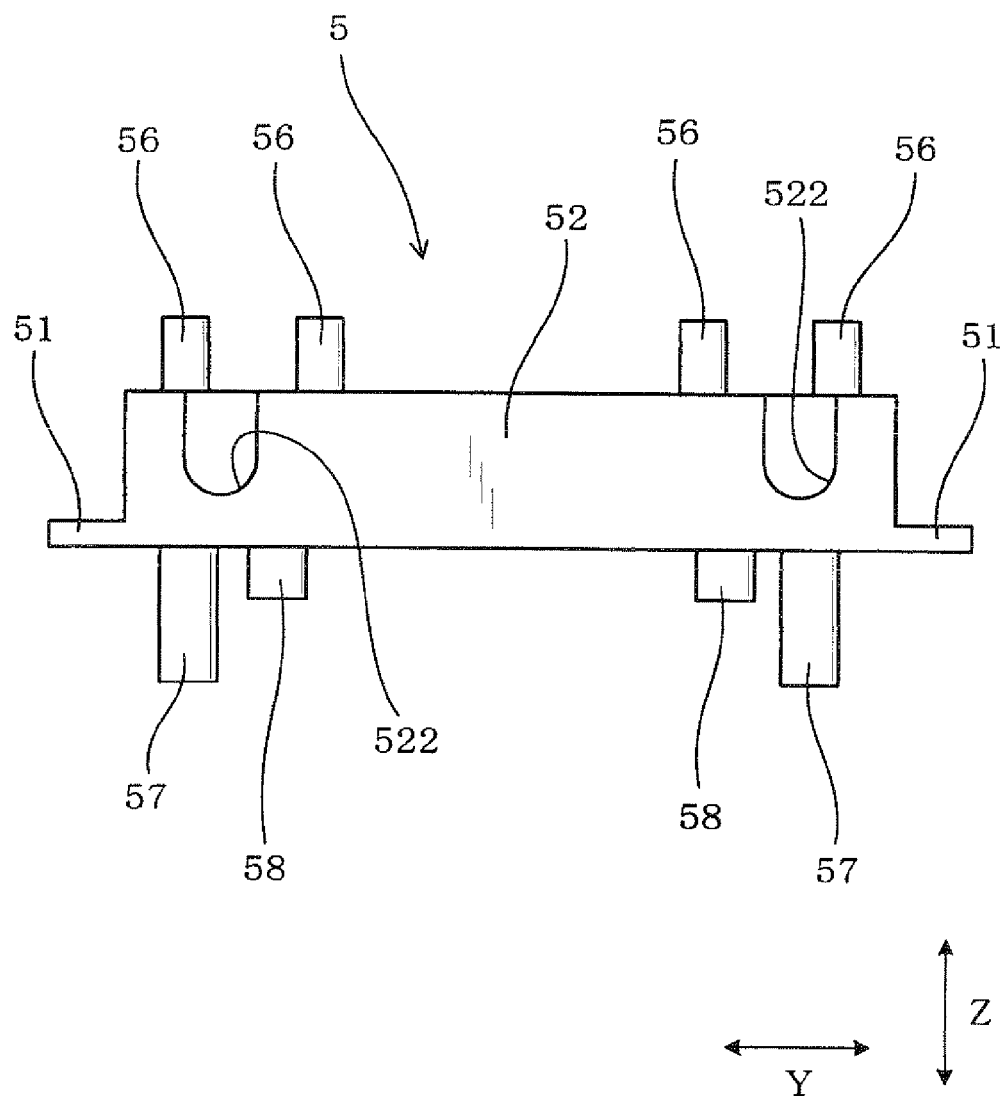
FIG. 6 is a front view of a frame of the first embodiment.

As shown in FIGS. 2, 4 and 5, the wall thicknesses t1 of the front wall section 52 and the rear wall section 53 are larger than the wall thickness t2 of the side wall section 54. Here, the wall thicknesses t1 and t2 are dimensions in the stacking direction X or lateral direction Y at portions to which the cooling tubes 30 are projected in the stacking direction X or lateral direction Y.

As shown in FIGS. 4 and 10, at least a part of each of the front wall section 52 and the rear wall section 53 forms an H-shaped wall section 55 having a roughly H-shaped cross section. The H-shaped wall section 55 is constituted of a pair of longitudinal plate sections 551 perpendicular to the stacking direction X, and a connecting section 552 connecting these longitudinal plate sections 551 together.

As shown in FIGS. 2 and 3, at least a part of each of the side wall sections 54 forms an L-shaped wall section having a roughly L-shaped cross section. As show in FIG. 5, the L-shaped wall section is constituted of a main wall portion 541 having a major surface facing the inner surface of the frame 5, and an inward portion 542 projecting toward the inner side of the frame 5 from one end of the main wall portion 541 in the direction perpendicular to the stacking direction X. In this embodiment, the L-shaped wall section is formed by the whole of the side wall section 54. As shown in FIGS. 2 and 7, the inward portion 542 of the side wall section 54 projects more inward in the vicinity of the support pin 14 than the other portion.

Figure 9:
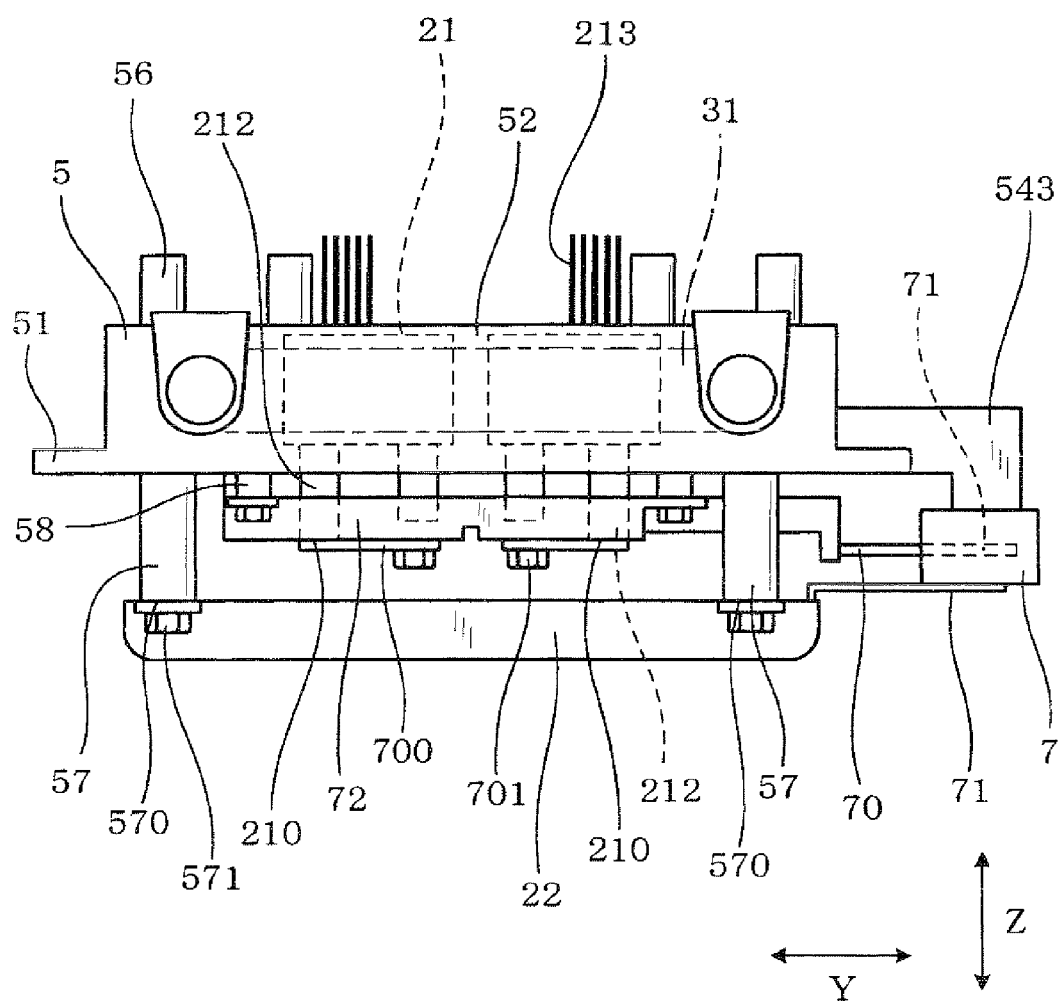
FIG. 9 is a view of a frame as viewed from the direction of the arrow C of FIG. 8.

The frame 5 is open at both sides in the height direction Z. As shown in FIGS. 9 and 10, the main electrode terminals 212 and the control terminals 213 of each semiconductor module 21 respectively project to one side (top side) of the height direction Z and the other side (bottom side) of the height direction Z. In the present application, the description is made assuming that the bottom side of the height direction Z corresponds to the direction of projection of the main electrode terminals 212, and the top side of the height direction Z corresponds to the direction of projection of the control terminals 213. However, this assumption is just for explanation. Likewise, the words "front", "rear", "lateral" are also just for explanation.

Figure 13:
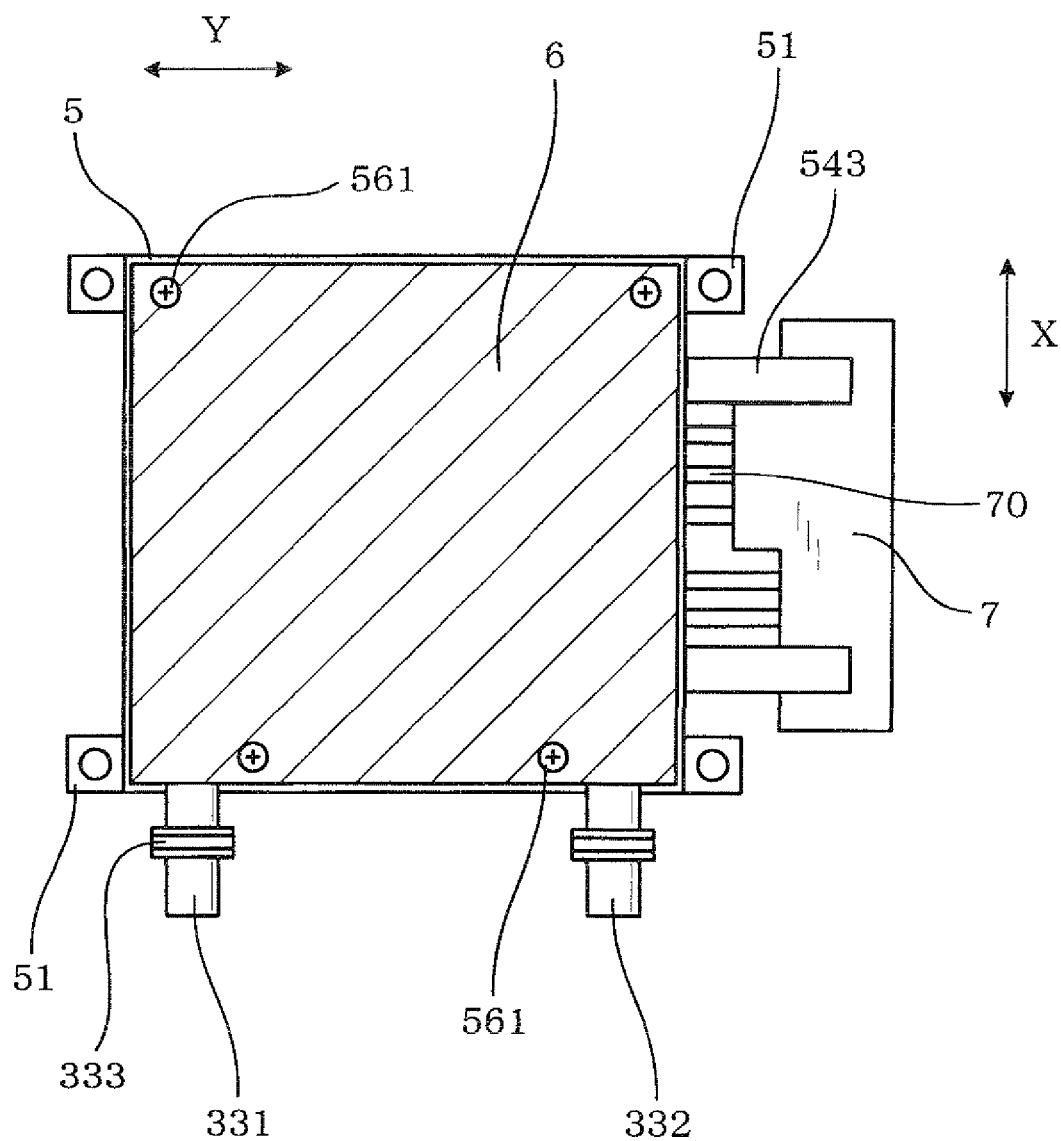
FIG. 13 is a plan view of a frame of the first embodiment on which a control circuit board is further installed, that is, a plan view of an internal unit of the first embodiment.

As shown in FIGS. 1 and 13 to 19, the internal unit 10 includes a control circuit board 6 on which a control circuit for controlling the switching elements included in the semiconductor modules 21 is formed. The control terminals 213 of the semiconductor module 21 are connected to the control circuit board 6. As shown in FIGS. 13 and 14, the unit fixing sections 51 of the frame 5 are located more outward than the outer edge of the control circuit board 6.

The frame 5 is, as shown in FIGS. 2, 14 and 15, provided with four board fixing sections 56 for fixing the control circuit board 6 to the internal unit 10, which are located more inward than the unit fixing sections 51. The board fixing sections 56 are constituted of two bosses formed in each of the front wall section 52 and the rear wall section 53 so as to project upward in the height direction Z. As shown in FIGS. 13 to 15, each of the board fixing sections 56 is formed with a threaded hole in which a screw 561 is inserted to secure the control circuit board 56 to the frame 5 in four positions.

The capacitor fixing sections 57 are constituted of two bosses formed in each of the front wall section 52 and the rear wall section 53 so as to project to the opposite side of the board fixing sections 56, that is, downward in the height direction Z. Each of the capacitor fixing sections 57 is formed with a threaded hole in which a bolt 571 is inserted to secure the capacitor 22 to the frame 5 in four positions.

Figure 12:
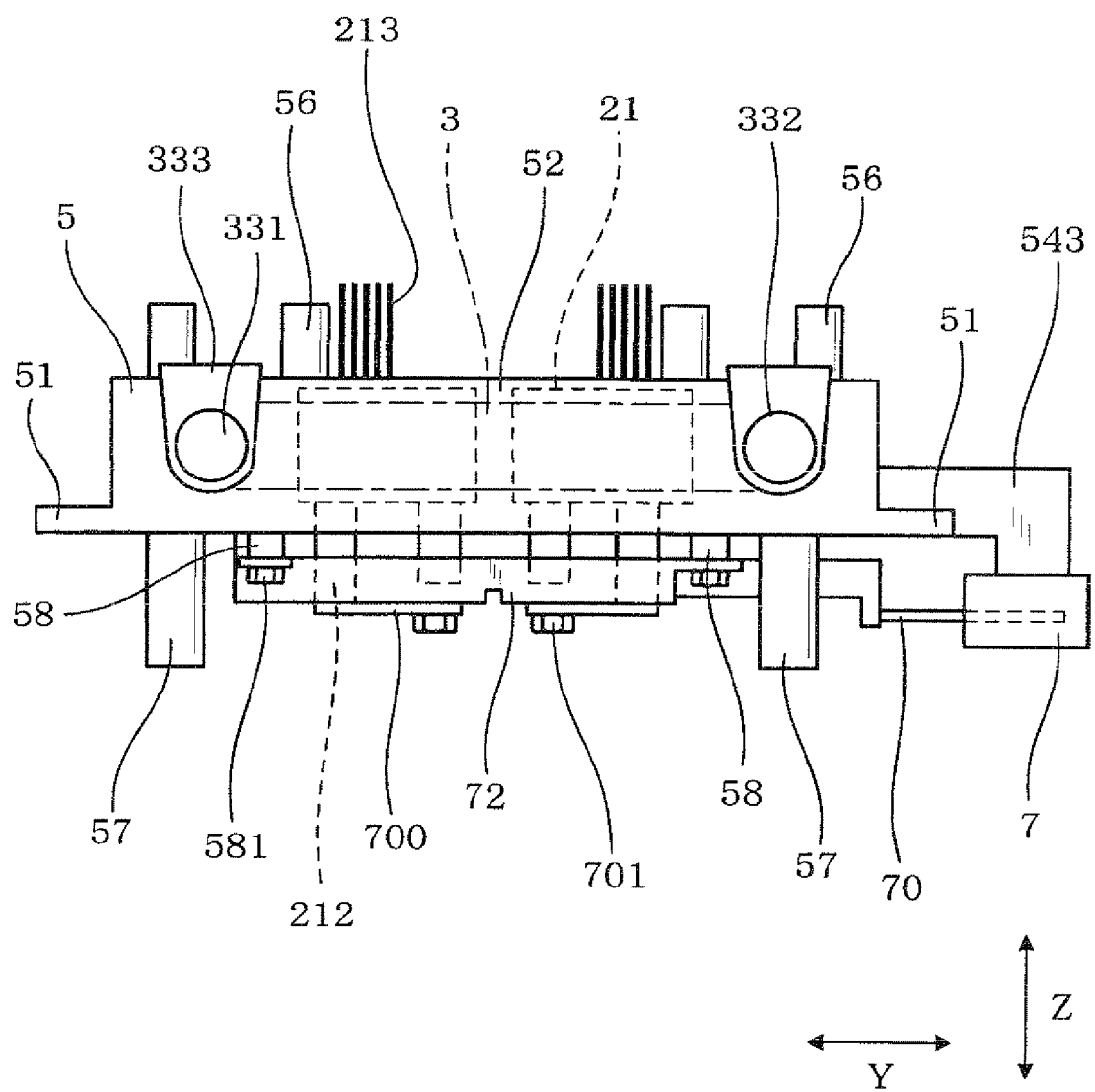
FIG. 12 is a view of the frame as viewed from a direction of the arrow E of FIG. 11.

The main conductor terminals 212 of the semiconductor modules 21, as illustrated in FIG. 12, protrude toward the capacitor 22. The capacitor fixing sections 57 protrude from the frame 5 toward the capacitor 22. The capacitor fixing sections 57 have top ends 570 located farther from the frame 5 than the top ends 210 of the main electrode terminals 212.

As shown in FIGS. 11 to 15, the internal unit 10 includes a terminal block 7 on which input/output terminals 71 for input and output of controlled electric power are mounted for making connection between the input/output terminals 71 and external devices such as a DC battery and a three-phase electric rotating machine. The terminal block 7 is fixed to two support arms 543 by bolts 544, the support arms 543 being formed in one of the side wall sections 54 so as to project outward.

The input/output terminals 71 include a pair of capacitor terminals 71P and 71N electrically connected to a pair of electrodes of the capacitor 22, and three output terminals 71U, 71V and 71W electrically connected to the main electrode terminals 212 of the semiconductor modules 21 and to be respectively connected to the U-phase, V-phase and W-phase electrodes of the three-phase electric rotating machine. The input/output terminals 71 are respectively formed at one ends of bus bars which are connected to the capacitor 22 or semiconductor modules 21 at the other ends thereof.

Of these bus bars, the ones 70 respectively formed with the output terminals 71U, 71V and 71W are partially molded with resin to form an integrated bus bar assembly 72. As shown in FIGS. 3, 14 and 15, the frame 5 includes bus bar fixing sections 58 for fixing the bus bar assembly 72. In this embodiment, the bus bar fixing sections 58 are formed in three positions. Two of the three bus bar fixing sections 58 are located at positions closer to the terminal block 7 than to the center of the frame 5.

Figure 11:
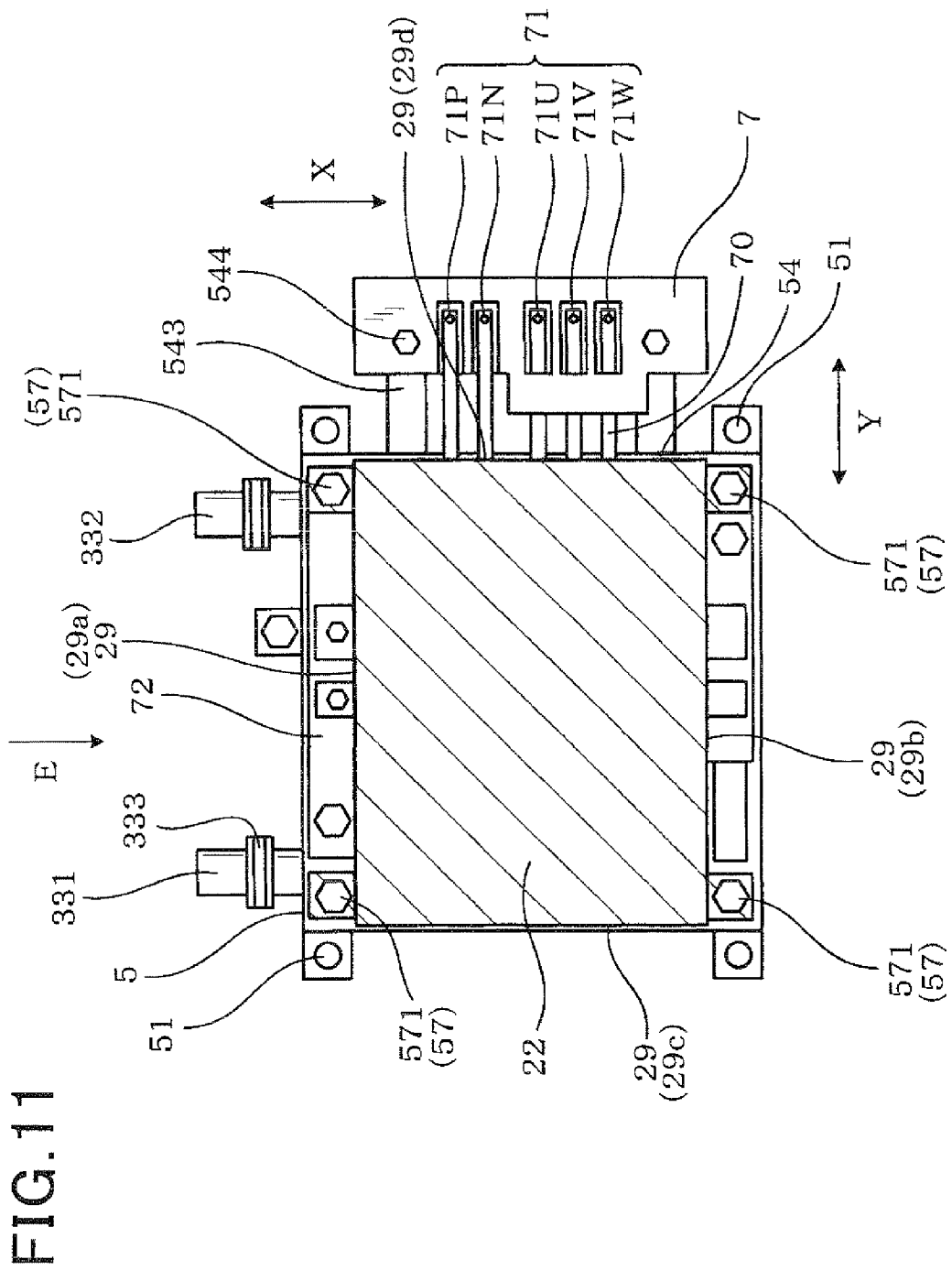
FIG. 11 is a plan view of a frame of the first embodiment on which a capacitor is further installed.

The input terminals 71 of the bus bars 70, as illustrated in FIG. 11, extend perpendicular to the side wall sections 54 of the frame 5 (i.e., the lateral direction Y). The capacitor fixing sections 57 are located outward of side surfaces 29a and 29b of the capacitor 22 in the stacking direction X. The side surfaces 29a and 29b are two of four side surfaces 29 of the capacitor 22 which extend parallel to each other in the lateral direction Y.

The pressure member 12 is, as can be seen in FIG. 7, disposed between the rear end of the stacked body 11 and the rear wall section 53 of the frame 5. The front end of the stacked body 11 is retained by the front wall section 52 of the frame 5. The coolant introduction tube 331 and the coolant discharge tube 332 are joined to the front end of the stacked body 11 to feed and discharge the coolant to and from the cooling tubes 31, respectively. The front wall section 52 has, as clearly illustrated in FIGS. 2 and 3, recesses or concave portions 522 in which the coolant introduction tube 331 and the coolant discharge tube 332 are placed. The capacitor fixing sections 57, as illustrated in FIG. 12, extend from the frame 5 toward the capacitor 22. As viewed from a direction in which the capacitor fixing sections 57 extend, the capacitor fixing sections 57, as illustrated in FIG. 3, at least partially overlap the concave portions 522.

The internal unit 10 includes all the electronic components constituting the power conversion circuit. That is, all the electronic components of the power conversion apparatus 1 belong to the internal unit 10, and none of the electronic components is directly fixed to the case 4. As shown in FIG. 1, the case 4 is constituted of a case body 40 which is open upward, and a lid body 400 closing the opening of the case body 40. The unit support sections 41 are formed integrally with the case body 40.

The case body 40 is provided with a flange section 42 around the outer periphery of the opening. Also, the lid body 400 is provided with a flange section 420 around the outer periphery thereof. The case body 40 and the lid body 400 are joined together with a seal member (not shown) interposed between their flange sections 42 and 420 by bolts 431 and nuts 432. Accordingly, the internal unit 10 is sealingly enclosed in the case 4.

Figure 19:
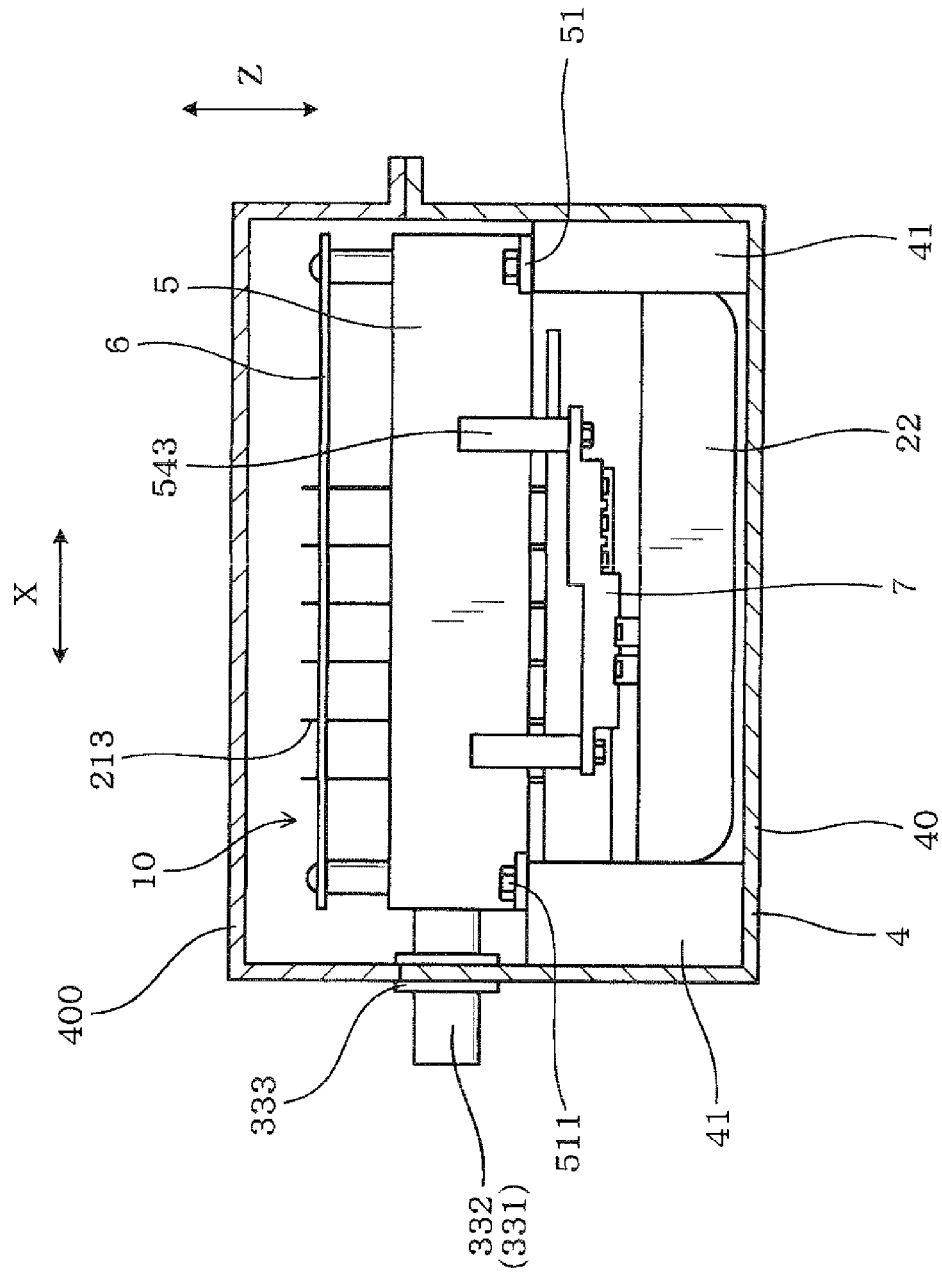
FIG. 19 is a cross-sectional view of a power conversion apparatus according to the first embodiment as viewed along the line G-G of FIG. 16.

As shown in FIGS. 16 and 19, each of the coolant introduction tube 331 and the coolant discharge tube 332 is connected to the stacked body 11 (see FIG. 7) so as to partially protrude from the case 4. Each of the coolant introduction tube 331 and the coolant discharge tube 332 is provided with an annular gasket or packing 333 at its outer periphery. The case body 40 is formed with two recesses (not shown) through which the coolant introduction tube 331 and the coolant discharge tube 332 pass, respectively. Each of the annular packings 333 is held between the case body 40 and the lid body 400 in the state of being fitted to the coolant introduction tube 331 or coolant discharge tube 332 in a corresponding one of the recesses. This creates a hermetical seal of the case 4 with the coolant introduction tube 331 and the coolant discharge tube 332 protruding outward from the case 4.

The case 4 also has formed therein through holes through which electric wires pass and in which electric connectors are installed for establishing electric connections of the electronic components and the control circuit board 6 with external devices. The through holes are provided with seal members to ensure water tightness of the case 4.

To assemble the power conversion apparatus 1 having the above-described structure, the internal unit 10 is assembled first as shown in FIGS. 13 to 15. Next, the internal unit 10 is accommodated and fixed in the case body 40 as shown in FIGS. 16 to 18. Finally, the internal unit 10 is sealingly enclosed in the case 4 by joining the lid body 400 to the case body 40 as shown in FIGS. 1 and 19.

To assemble the internal unit 10, the frame 5 shown in FIGS. 2 to 6 is first prepared. Next, the stacked body 11 of the semiconductor modules 21 and the cooling tubes 31 stacked alternately is disposed inside the frame 5, as shown in FIGS. 7 and 10. Incidentally, the cooling tubes 31 are coupled together through the joint tubes 32, and the cooler 33 including the coolant introduction tube 331 and the coolant discharge tube 332 connected thereto is assembled before the above step. When the stacked body 11 is disposed inside the frame 5, the coolant introduction tube 331 and the coolant discharge tube 332 are respectively placed on the concave portions 522 formed in the frame 5 (see FIGS. 2 and 6).

The pressure member 12 is disposed between the rear end of the stacked body 11 and the rear wall section 53. Subsequently, the pressure member 12 is pushed forward at around both ends thereof by a pressure jig while being elastically deformed in the stacking direction X in order to compress the stacked body 11. When the pressure member 12 is deformed by a predetermined amount, the column-shaped support pins 14 are inserted between the rear wall section 53 of the frame 5 and each end of the pressure member 12. Thereafter, the pressure jig is pulled away from the pressure member 12 while being moved backward in order to bring the pair of the support pins 14 to the state of being held between the pressure member 12 and the rear wall section 53. This state is also a state in which the stacked body 11 is compressed in the stacking direction X by a predetermined pressure due to an urging force applied from the pressure member 12.

Figure 8:
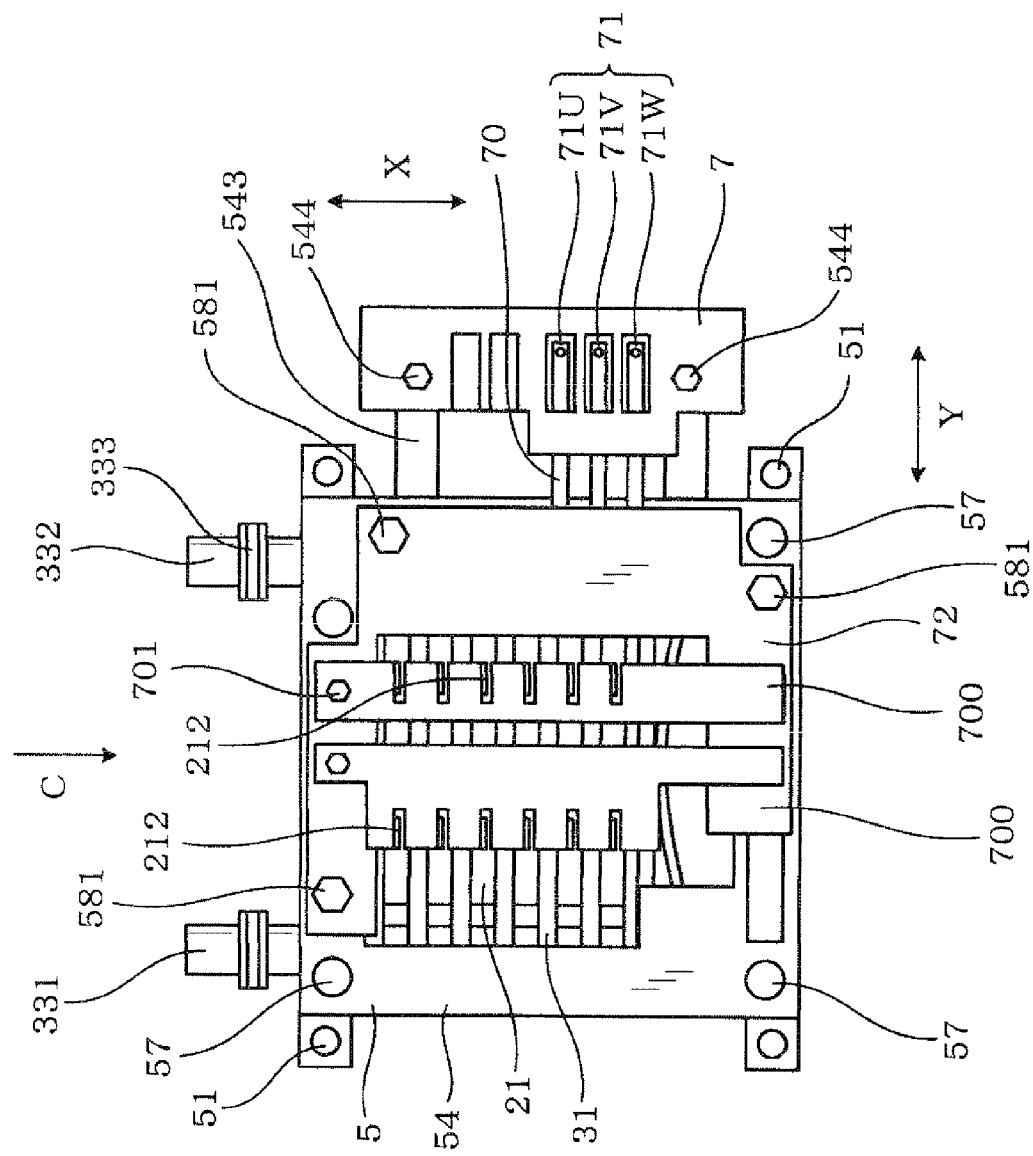
FIG. 8 is a plan view of the frame of the first embodiment on which a bus bar assembly is further installed.

Next, the terminal block 7 is fixed to the support arms 543 of the frame 5 by the bolts 544 as shown in FIGS. 7 to 9. Next, the bus bar assembly 72 molded by resin with the bus bars 70 is secured to the frame 5. The bus bars 70 are then welded to the main electrode terminals 212 of the semiconductor modules 21. Further, the input/output terminals 71U, 71V and 71W formed in the bus bars 70 are placed on the terminal block 7. The bus bar assembly 72 is fixed to bus bar fixing sections 58 formed at three positions in the frame 5 by bolts 581.

Thereafter, bus bars 700 for use in achieving electric connections between the semiconductor modules 21 and the capacitor 22 are welded to the main electrode terminals 212 of the semiconductor modules 21, and fixed to the bus bar assembly 72 by bolts 701.

Next, as shown in FIGS. 11 and 12, the capacitor 22 is fixed to the lower side of the frame 5. More precisely, the capacitor 22 is secured to the capacitor fixing sections 57 provided in the frame 5 by the bolts 571, and the pair of the capacitor terminals 71P and 71N are disposed on the terminal block 7.

Next, the control circuit board 6 is, as illustrated in FIGS. 13 to 15, disposed above the frame 5. The control terminals 213 of the semiconductor modules 21 are inserted and connected into the through holes formed in the control circuit board 6. Subsequently, the circuit board 6 is fixed to the board fixing sections 56 of the frame 5 by the screws 561. This completes assembly of the internal unit 10.

Thereafter, as shown in FIGS. 16 to 18, the internal unit 10 is fixed to the case body 40. More precisely, the unit fixing sections 51 of the frame 5 which serves as an outer shell of the internal unit 10 are placed on the upper surfaces of the unit support sections 41 formed in the ease body 40. At this time, the annular packings 333 attached to the coolant introduction tube 331 and the coolant discharge tube 332 are respectively fitted into the recesses formed in the case body 40. The bolts 511 are then inserted into the through holes formed in the unit fixing sections 51, and screwed into the threaded holes formed in the unit support sections 41 to fix the internal unit 10 to the case body 40.

Subsequently, the lid body 400 is, as shown in FIGS. 1 and 19, placed on the opening of the case body 40 with the seal member being interposed therebetween. The lid body 400 and the case body 40 are joined together at their flange sections 42 and 420 by the bolts 431 and the nuts 432. The internal unit 10 is, thus, sealingly enclosed in the case 4. This completes assembly of the power conversion apparatus 1.

Beneficial effects and advantages of this embodiment will be described below.

The power conversion apparatus 1 has the structure in which the electronic components (the semiconductor modules 21, capacitor 22 and so on) and the cooler 3 are fixed to the frame 5, so that the electronic components, the cooler 3 and the frame 5 are integrated as the internal unit 10. The internal unit 10 is fixed within the case 4. The internal unit 20, therefore, functions as a beam of the case 4 which enhances the rigidity of the case 4 without need for increasing the thickness of the case 4 itself and forming reinforcing ribs on the case 4. This permits material or production costs to be reduced and the weight of the case 4 to also be decreased.

The internal unit 10 is secured to the case 4, thereby suppressing external force acting on the respective electronic components and the cooler 3 of the internal unit 10 through the case 4. This also suppresses the electronic components and the cooler 3 of the internal unit 10 from being affected by external vibration and thermal stress.

The electronic components and other members are not directly fixed to the case 4, but assembled in the internal unit 10 to be fixed to the case 4. Accordingly, assembling work of the power conversion apparatus 1 becomes easy. Also, maintenance of the power conversion apparatus 1 becomes easy, because the whole internal unit 10 can be removed from the case 4 for maintenance work.

Since assembly and maintenance of the internal unit 10 may be carried out outside the case 4, the case 4 does not have to be provided with two or more lids. Accordingly, the sealing surface between the case body 40 and the lid body 400 can be one in number. This improves the water tightness of the case 4, and reduces the sealing material of the case 4, to thereby reduce the material cost and man-hour cost for application of the sealing material to the case 4. The internal unit 10 is sealingly enclosed in the case 4. That is, since the whole internal unit 10 including the frame 5 is sealingly enclosed in the case 4, the sealing surface can be one in number.

The internal unit 10 is fixed to the frame 5 within the case 4 and serves as a beam of the case 4 as described above, thus resulting in an increase in rigidity of the case 4. The frame 5 is made of a conductive material and is shaped to surround all around the semiconductor modules, thereby shielding electromagnetic noise emitted from the semiconductor modules 21. The case 4 is also made of a conductive material, and accordingly electromagnetic noise emitted from the semiconductor modules 21 is shielded doubly by the frame 5 and the case 4.

The internal unit 10 has installed thereon the capacitor 22, thereby decreasing external force to be applied to the capacitor 22 and also reducing mechanical vibration to be transmitted from the capacitor 22 to the case 4. This minimizes transmission of undesirable noise arising from the vibration of the capacitor 22 to, for example, inside a cabin of an automotive vehicle in which the power conversion apparatus 1 is installed.

The capacitor fixing sections 57 of the frame 5 are located inward more than the unit fixing sections 51, thus permitting the unit fixing sections 51 to be positioned outside the capacitor 22 when the internal unit 10 made by mounting the capacitor 22 on the frame 5 is secured to the case 4. This minimizes the possibility of physical interference of the capacitor 22 with the case 4 when the internal unit 10 is mounted within the case 4.

The ends of the frame 5 may be an antinode of vibration, so that the amplitude of vibration thereof will be great, while the center of the frame 5 may be a node of vibration, so that the amplitude of vibration will be small. The amplitude of vibration of the capacitor fixing sections 57 is, therefore, decreased by locating the capacitor fixing sections 57 closer to the center of the frame than the unit fixing sections 51. This minimizes the transmission of vibration to the capacitor 22, thus resulting in a decreased possibility of malfunction of the capacitor 22.

Figure 28:
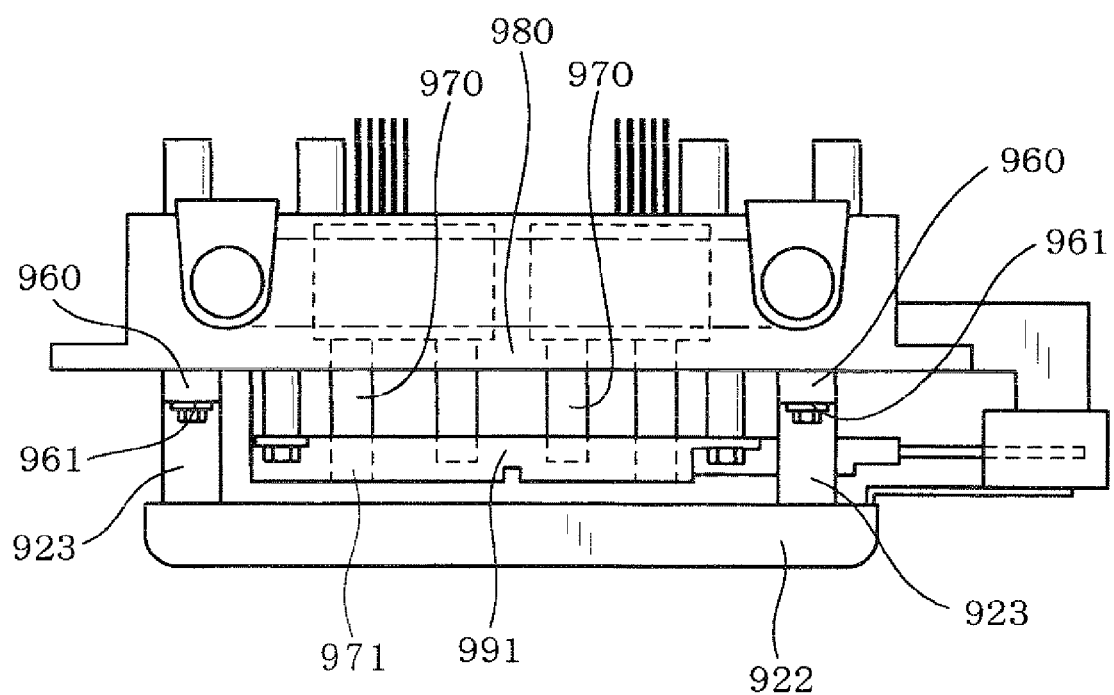
FIG. 28 is a side view of a comparative example of a power conversion apparatus.

The top ends 570 of the capacitor fixing sections 57 are, as can be seen in FIG. 12, located farther from the major body of the frame 5 than the top ends 210 of the main electrode terminals 212 of the semiconductor modules 21. This ensures heat and vibration resistance of the power conversion apparatus 1 and also facilitate ease of assembling the power conversion apparatus 1. Specifically, the main electrode terminals 212 project toward the capacitor 22. Therefore, if top ends 971 of main electrode terminals 970, as illustrated in FIG. 28, are located farther from a frame 980 than top ends 961 of capacitor fixing sections 960, it will result in physical interference of the main electrode terminals 970 with a capacitor 922 unless protrusions 923 such as bosses are provided on the capacitor 922. The outer shell of the capacitor 922 is usually made of resin. The protrusions 923, thus, must be made of resin, so that it will susceptible to mechanical vibration or thermal stress. The top ends 210 of the main electrode terminals 212 of the semiconductor modules 21 are, as described above in FIG. 12, located closer to the frame 5 than the top ends 570 of the capacitor fixing sections 57, thus enabling the capacitor 22 to be joined to the capacitor fixing sections 57 without having to form any protrusions on the capacitor 22. The capacitor fixing sections 57 are made of metal like the frame 5 and thus insusceptible to the vibration or thermal stress.

The stacked body 11 in which the cooling tubes 31 and the semiconductor modules 21 are stacked alternately is, as illustrated in FIGS. 7 and 10, disposed in the internal unit 10. This permits the stacked body 11 to be assembled outside the case 4, which facilitates the ease of assembling the power conversion apparatus 1.

The stacked body 11 is constituted of the cooling tubes 31 and the semiconductor modules 21 stacked alternately, thus enabling the semiconductor modules 21 to be cooled efficiently, and the stacked body 11 to be made compact in size.

Figure 29:
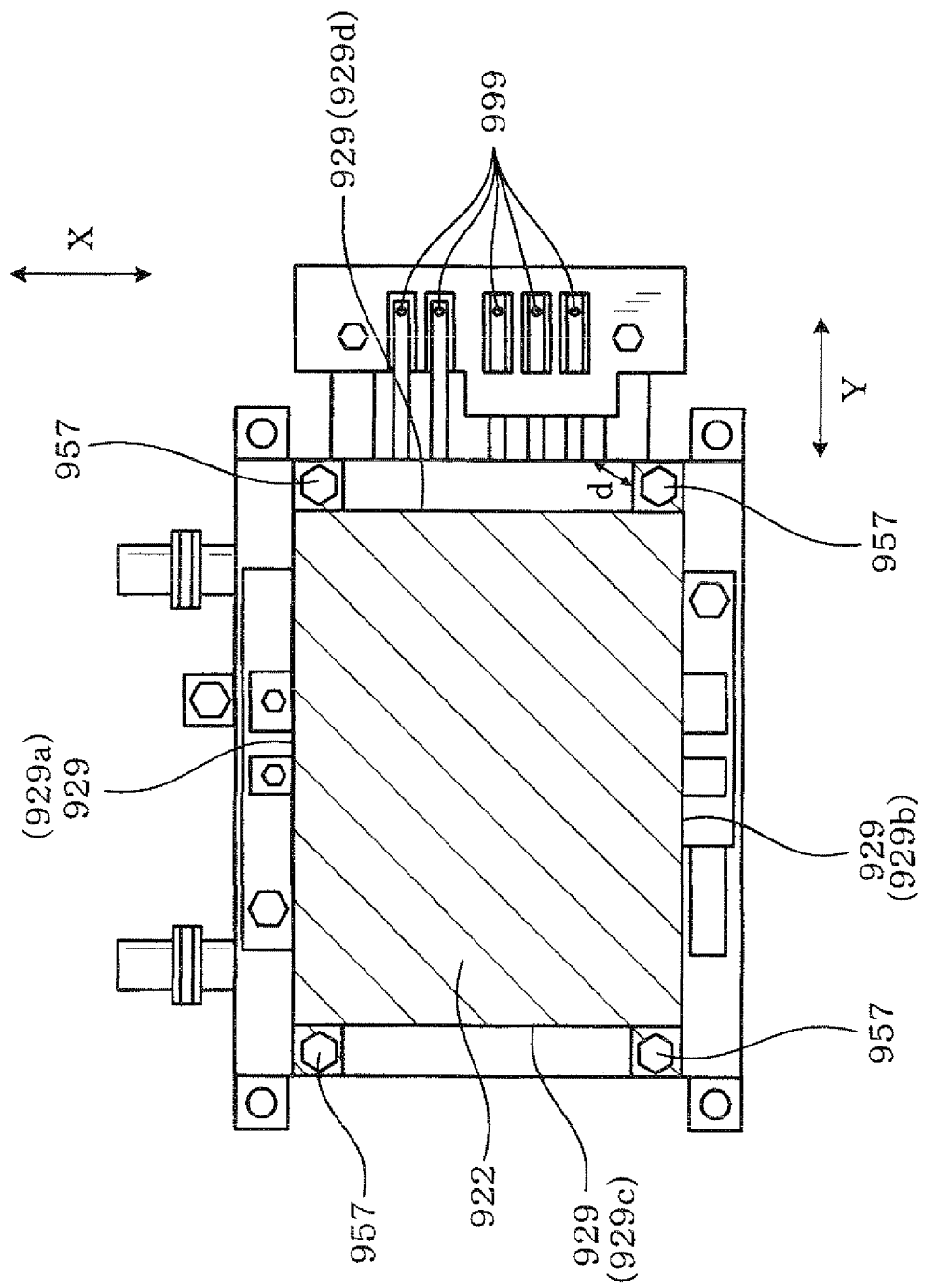
FIG. 29 is a plane view of a comparative example of a power conversion apparatus.

The input/output terminals 71 of the bus bars 70, as illustrated in FIG. 11, extend perpendicular to the side wall section 54 of the frame 5. The capacitor fixing sections 57 are located in outside the side surfaces 29a and 29b of the capacitor 22 in the stacking direction X. The side surfaces 29a and 29b extend parallel to each other and perpendicular to the stacking directions X. This permits the power conversion apparatus 1 to be reduced in size. Specifically, the capacitor fixing sections 57 are usually made of metal like the frame 5. The input/output terminals 71 are usually subjected to high-voltage. It is, thus, necessary to place the capacitor fixing sections 57 and the input/output terminals 71 away from each other in order to ensure electric insulation therebetween. If capacitor fixing sections 957 are, as illustrated in FIG. 29, located outside side surfaces 929c and 929d in the lateral direction Y which are two of side surfaces 929 of a capacitor 922 and extend parallel to each other in the stacking direction X, it will result in a decreased minimum distance d between input/output terminals 999 and the capacitor fixing sections 957. The distance d, therefore, has to be increased in order to ensure a required degree of the insulation between the input/output terminals 999 and the capacitor fixing sections 957, which will result in an increase in overall size of the power conversion apparatus. The power conversion apparatus 1 of this embodiment is, as described above in FIG. 11, designed to have the capacitor fixing sections 57 located outside the parallel extending side surfaces 29a and 29b of the capacitor 22 in the stacking directions X, respectively, so that the capacitor fixing sections 57 will be remote from the input/output terminals 71, thus eliminating the need for increasing the size of the frame 5 and permitting the power conversion apparatus 1 to be made compact in size.

The internal unit 10 is equipped with the pressure member 12. The pressure member 12 is interposed between the rear wall section 53 of the frame 5 and the rear end of the stacked body 11 whose front end is supported by the front wall section 52 of the frame 5. The reaction force of the pressure member 12 is, therefore, absorbed by the frame 5. This eliminates the need for the case 4 to have rigidity large enough to bear the reaction force of the pressure member 12, or to include ribs, thus permitting the case 4 to be light in weight and less expensive.

The front wall section 52, as illustrated in FIG. 2, has formed therein the two concave portions 522 on which the coolant introduction tube 331 and the coolant discharge tube 332 are placed. As viewed from a direction in which the capacitor fixing sections 57 extend, the capacitor fixing sections 57, as illustrated in FIG. 3, at least partially overlap the concave portions 522. This enhances the rigidity of the frame 5. Specifically, the formation of the concave portions 522 in the front wall section 52 of the frame will result in a decrease in rigidity of the frame 5. The overlapping of the capacitor fixing sections 57 with the concave portions 522, however, compensates for such a lack of rigidity of the frame 5, thereby minimizing the deformation of the frame 5 arising from exertion of physical pressure from the pressure member 12.

The frame 5 includes the four unit fixing sections 51, two of them being disposed on one side of the stacking direction X, the other two of them being disposed on the other side of the stacking direction X. The four unit fixing sections 51 are located more outward in the stacking direction X than the pair of the support portions of the frame 5 (the inner surface 521 of the front wall section 52 and the inner surface 531 of the rear wall section 531) applied with the reaction force toward outside in the stacking direction X from the stacked body 11 and the pressure member 12. Accordingly, the frame 5 servers to resist the reaction force of the stacked body 11 and the pressure member 12 with the aid of the case 4. This is because the case 4 reinforces the frame 5, to thereby prevent the frame 5 from being deformed.

The frame 5 has the front wall section 52, the rear wall section 53 and the pair of the side wall sections 54. This ensures the stability in retaining the stacked body 11 within the frame 5. The wall thickness of the front and rear wall sections 52 and 53 is larger than that of the side wall sections 54. That is, as shown in FIGS. 4 and 5, the wall thickness t1 is larger than the wall thickness t2. This improves the rigidity of the front and rear wall sections 52 and 53 subjected to the reaction force of the pressure member 12 and also allows the side wall sections 54 not subjected directly to the reaction force of the pressure member 12 to be reduced in weight. This also permits the frame 5 to be light in weight and ensures the frame 5 to have rigidity large enough to resist the reaction force of the pressure member 12.

A portion of each of the front and rear wall sections 52 and 53 is, as illustrated in FIG. 4, made to include the roughly H-shaped wall section 55, thus permitting the frame 5 to be made light in weight and ensures the high rigidity of the front and rear wall sections 52 and 53. Each of the side wall sections 54 is, as shown in FIG. 5, constituted as the roughly L-shaped wall section, thus permitting the weight of the side wall sections 54 and the material cost to be reduced without sacrificing the rigidity thereof.

The semiconductor modules 21 stacked together with cooling tubes 31, as shown in FIG. 10, have the structure in which the main electrode terminals 212 and the control terminals 213 project in opposite height directions Z, and the frame 5 is open in the opposite height directions Z. This facilitates ease of connecting the bus bars 70 and 700 and the control circuit board 6, as illustrated in FIGS. 8 and 13 to 15, to the semiconductor modules 21.

The internal unit 10 includes the control circuit board 6, thus eliminating the need for installing the control circuit board 6 directly to the case 4, which will facilitate the assembling work of the control circuit board 6 and result in a decrease in external force acting on the control circuit board 6.

The unit fixing sections 51 of the frame 5 are, as illustrated in FIG. 2, located outward of the outer edge of the control circuit board 6. This result in ease of installation of the internal unit 10 within the case 4. This is because if the unit fixing sections 51 are located inward of the outer edge of the control circuit board 6, the internal unit 10 assembled with the control circuit board 6 cannot be easily fixed to the case 4. In this case, to fix the internal unit 10 to the case 4, it is necessary to drill holes penetrating the wall of the case 4 through which bolts or the like are inserted in, for example. However, in this case, not only the workability is lowered, but also more sealing members have to be used to ensure the water tightness of the case 4. By locating the unit fixing sections 51 outward of the outer edge of the control circuit board 6, such a problem will be alleviated.

The board fixing sections 56 of the frame 5 are located more inward than the unit fixing sections 51. This facilitates connecting the control circuit board 6 to the frame 5, and connecting the internal unit 10 to the case 4.

The internal unit 10 is equipped with the terminal block 7, thus allowing the terminal block 7 to be secured to the internal unit 10 outside the case 4, which results in ease of assembling work of the terminal block 7.

The frame 5 includes the plurality of the bus bar fixing sections 58 for fixing the bus bars 70 and the bus bar assembly 72. This ensures the stability in retaining the bus bars 70 and the bus bar assembly 72 on the frame 5. Two of the bus bar fixing sections 58 are, as shown in FIGS. 3 and 8, located closer to the terminal block 7 than to the center of the frame 5. This ensures the stability in retaining the bus bar assembly 72 on the frame 5 and also in mounting the input/output terminals 71 on the terminal block 7, thus assuring electric connections of the input/output terminals 71 with external terminals.

The internal unit 10 has installed therein all the electronic components constituting the power conversion circuit, thereby protecting the electronic components from an external force and facilitating ease of manufacturing the power conversion apparatus and resulting in good maintainability of the electronic components.

As described above, according to the first embodiment, there is provided a less expensive power conversion apparatus which is capable of reducing an external force applied to its electronic components while improving the rigidity of its case, and is excellent in water tightness and maintainability.

Second Embodiment

Next, a second embodiment of the invention will be described with reference to FIGS. 20 to 26. In the second embodiment, a wire holding section 59 for holding a conductive wire 15 is additionally provided in the frame 5 of the power conversion apparatus 1. At least one end of the conductive wire 15 is disposed within the case 4. In this embodiment, the conductive wire 15 connects the capacitor 22 with the control circuit board 6 within the case 4, so that the voltage across the capacitor 22 can be sent to the control circuit board 6 through the conductive wire 15 as a voltage signal indicative of the input voltage of the power conversion apparatus 1. The conductive wire 15 is covered with resin except both ends thereof, and has flexibility. The conductive wire 15 is laid outside the frame 5 to make a connection between the control circuit board 6 and the capacitor 22.

Figure 20:
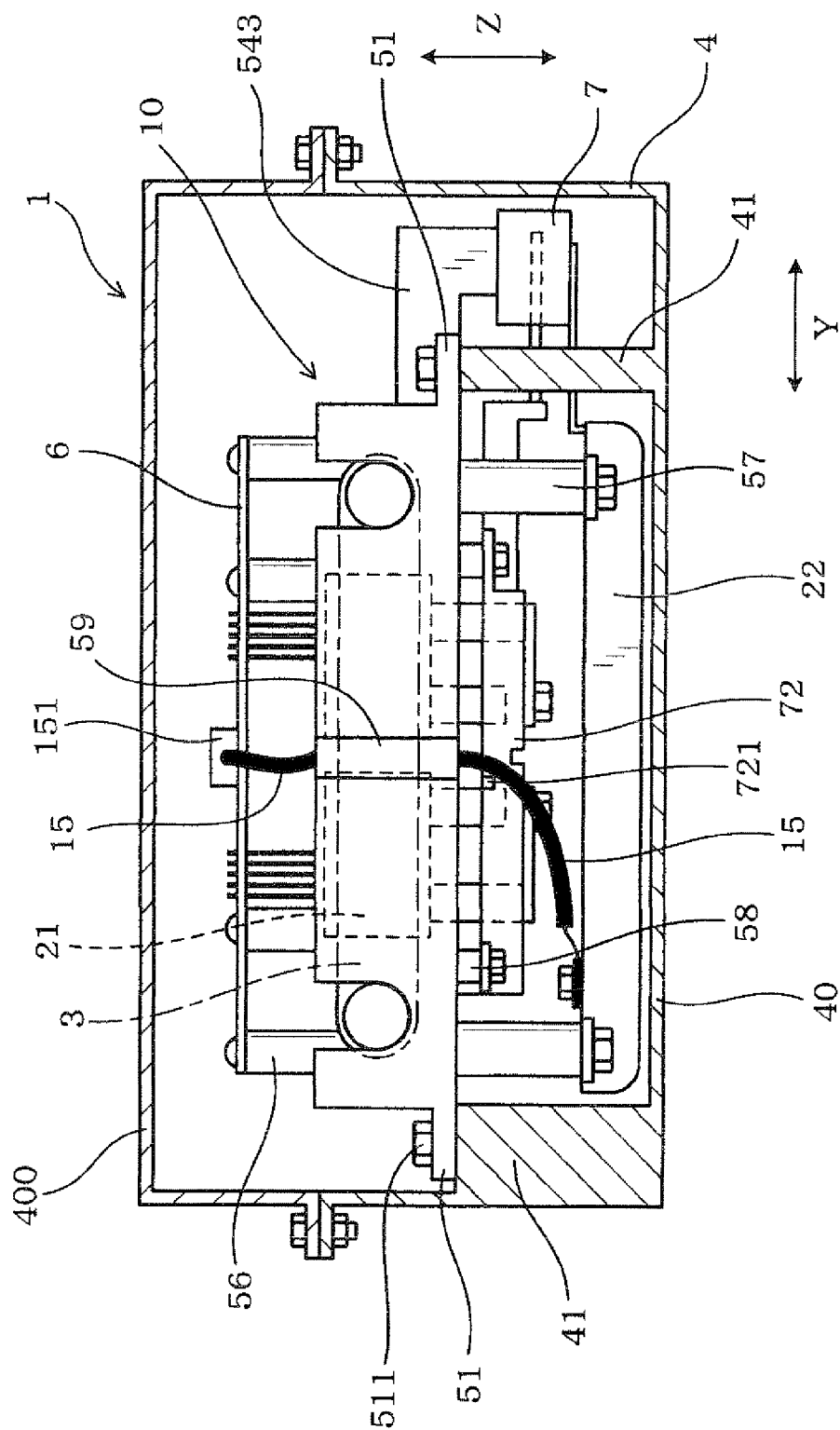
FIG. 20 is a cross-sectional view of a power conversion apparatus according to the second embodiment of the invention.
Figure 21:
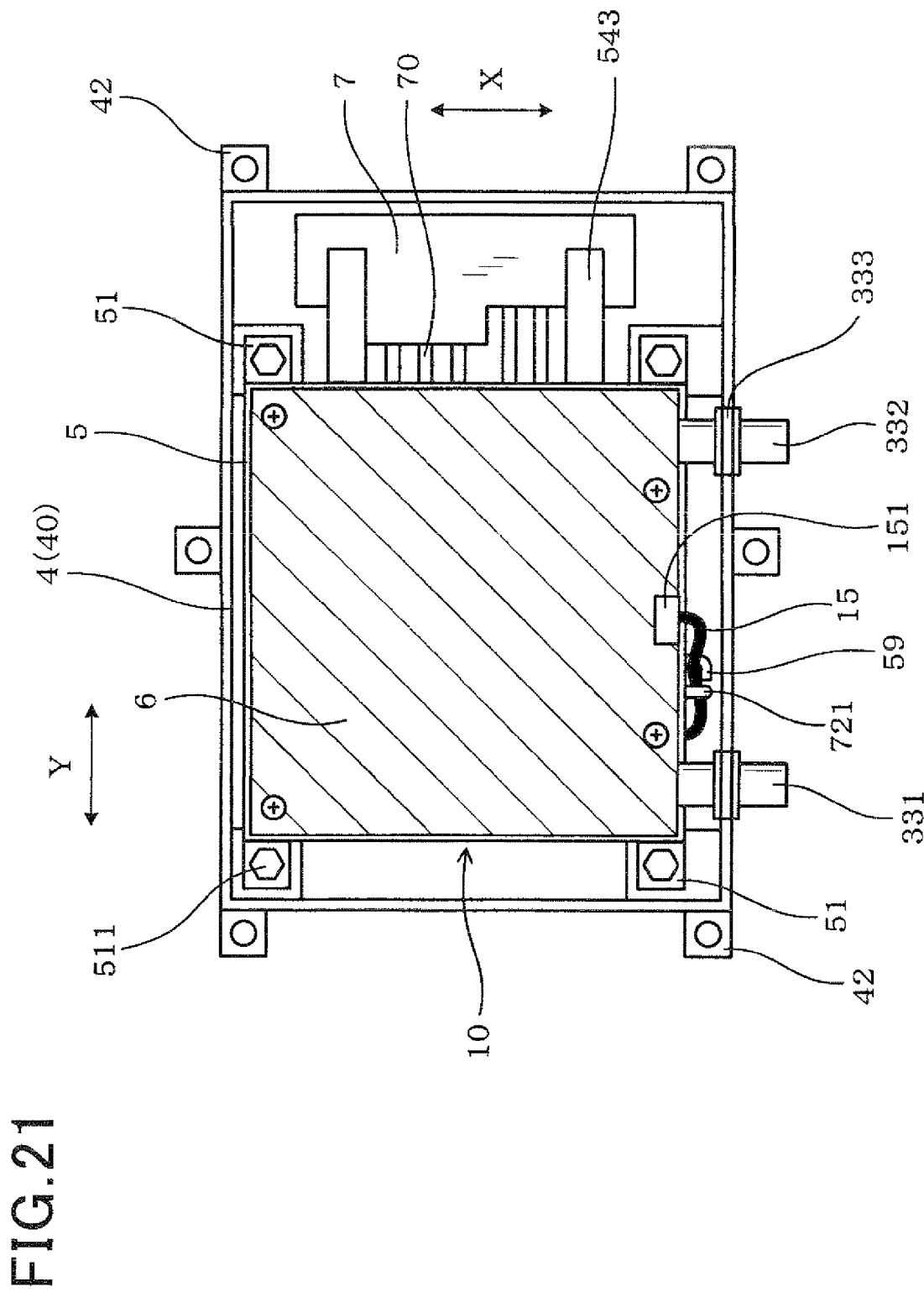
FIG. 21 is a plan view of a power conversion apparatus according to the second embodiment before a lid body is assembled.
Figure 22:
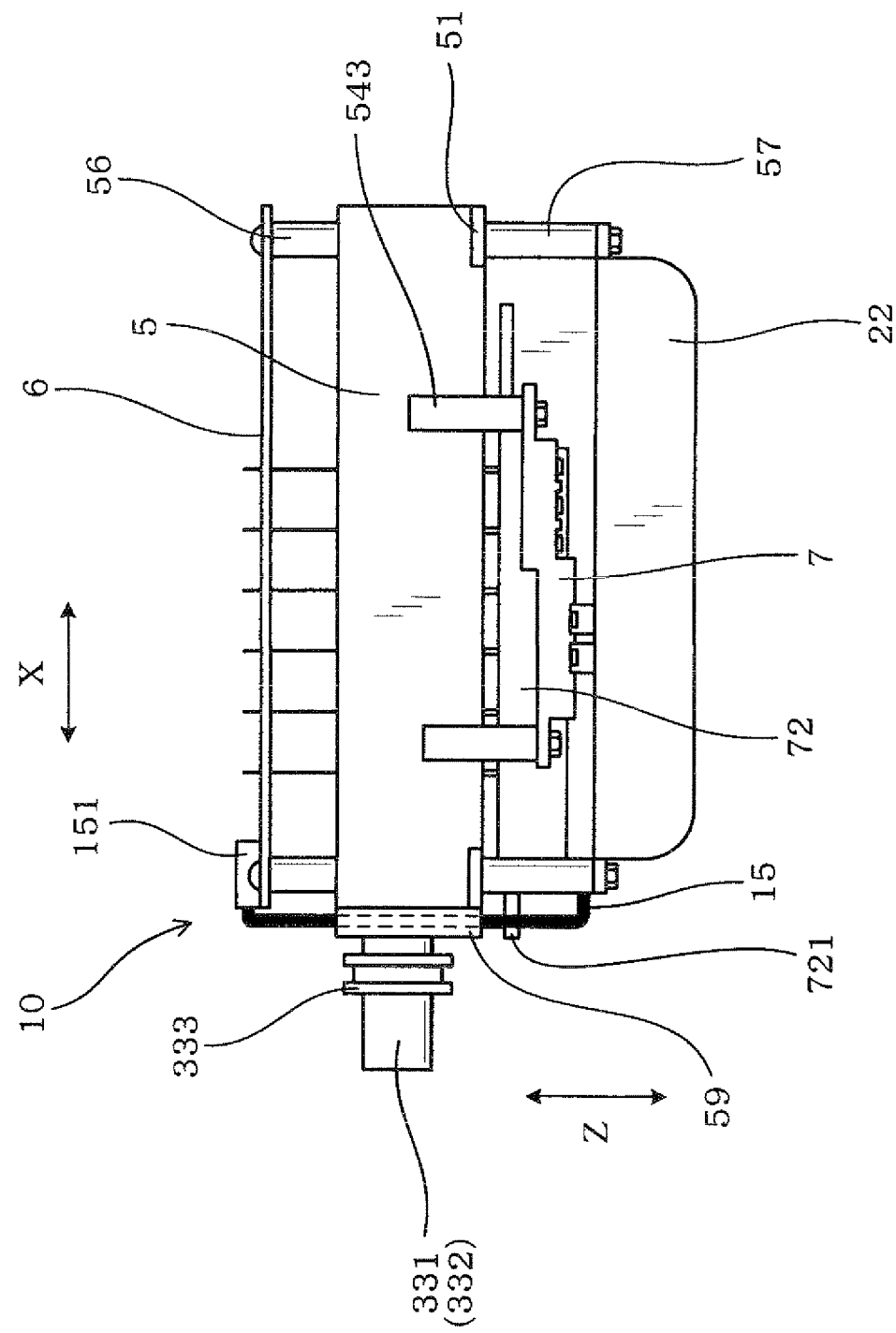
FIG. 22 is a side view of an internal unit of a power conversion apparatus according to the second embodiment.
Figure 23:
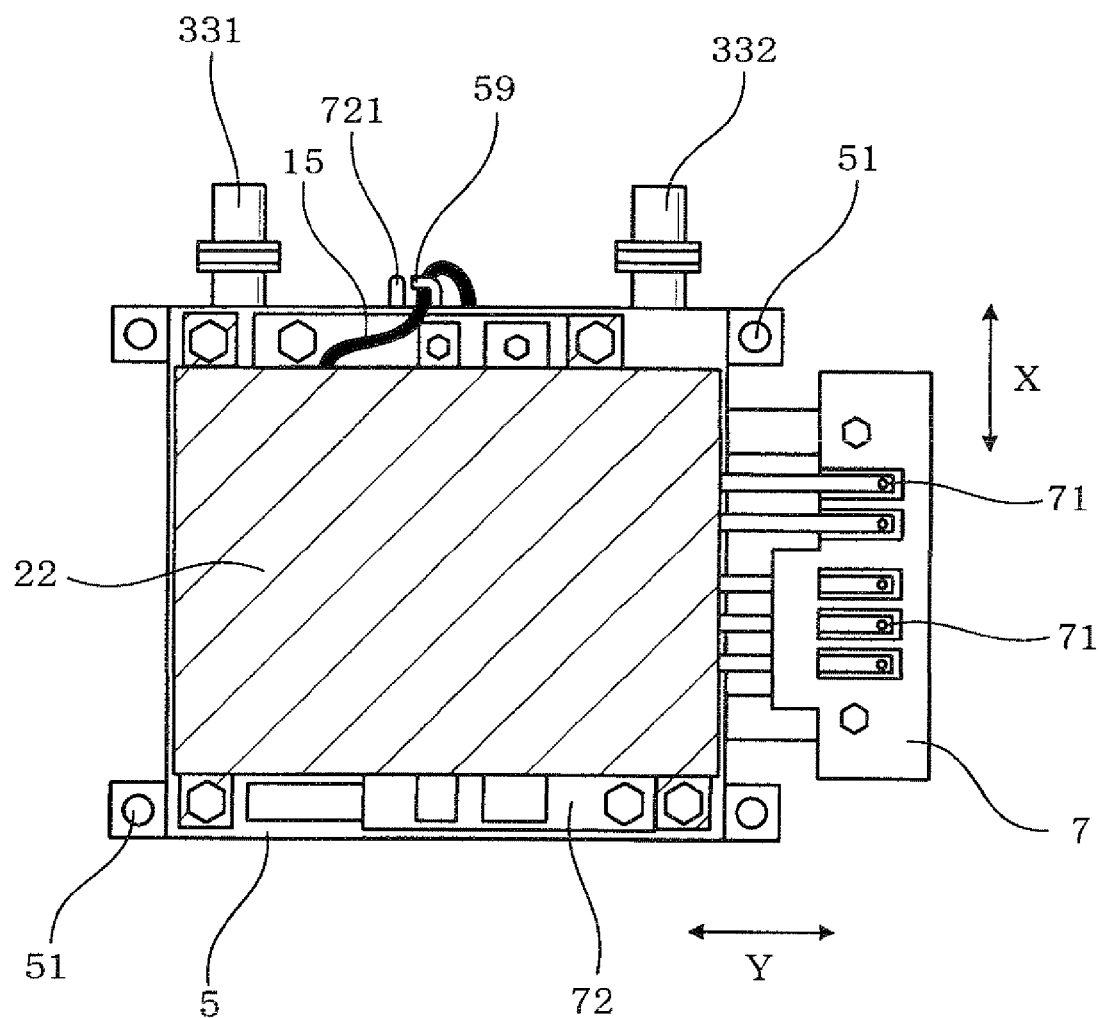
FIG. 23 is a bottom view of an internal unit of the second embodiment.
Figure 24:
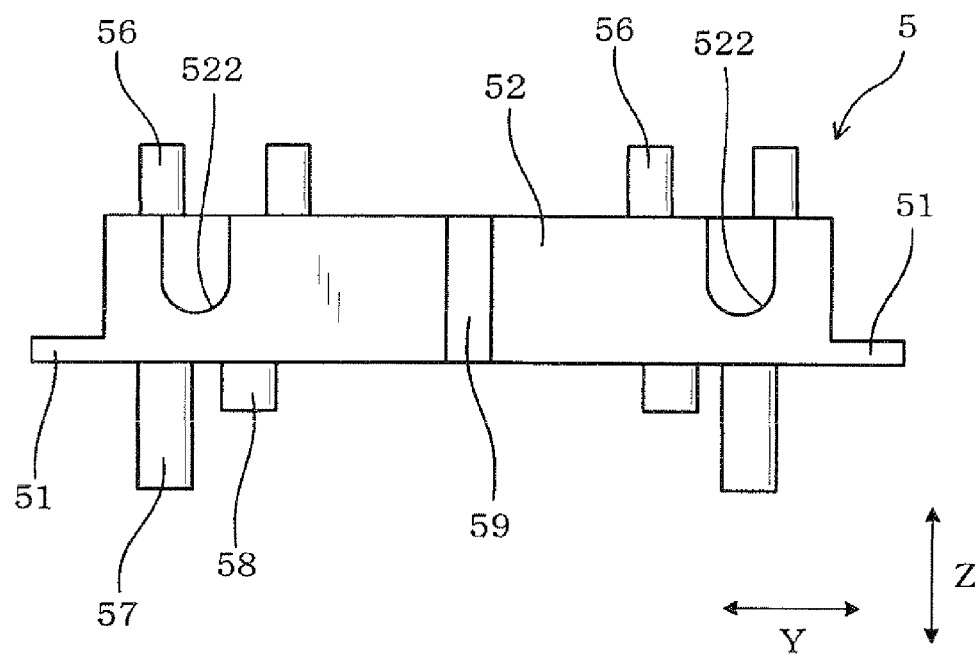
FIG. 24 is a front view of a frame of a power conversion apparatus according to the second embodiment.
Figure 25:
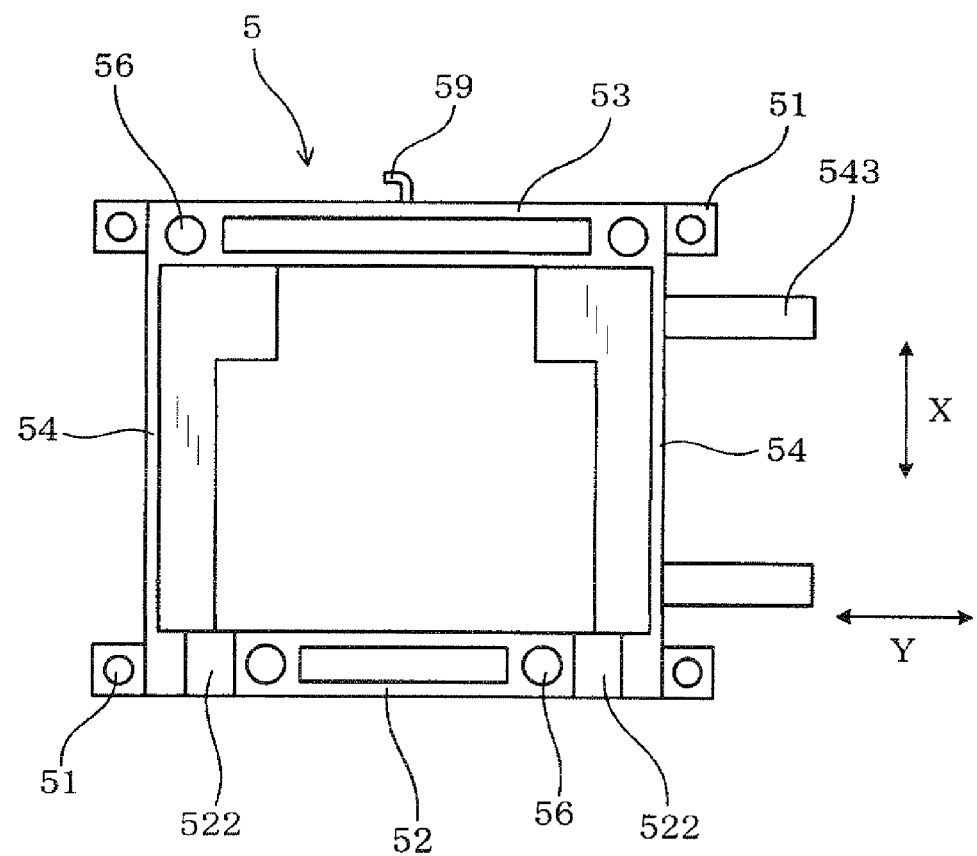
FIG. 25 is a plan view of a frame of the second embodiment.
Figure 26:
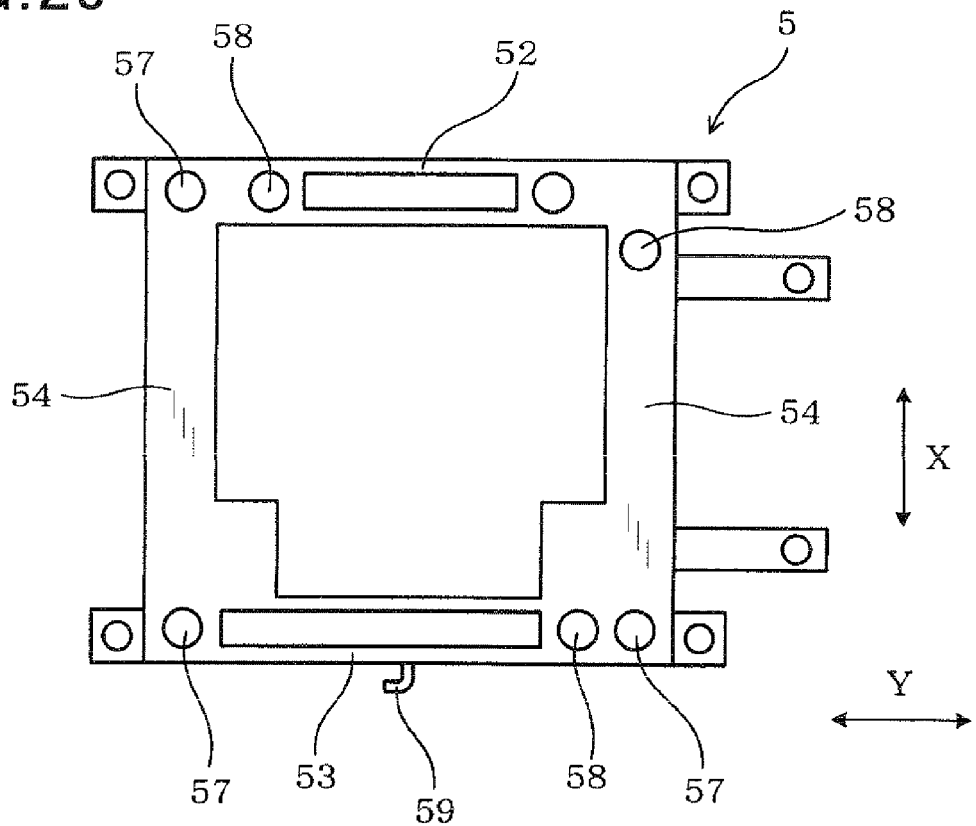
FIG. 26 is a bottom view of a frame of the second embodiment.
Figure 27:
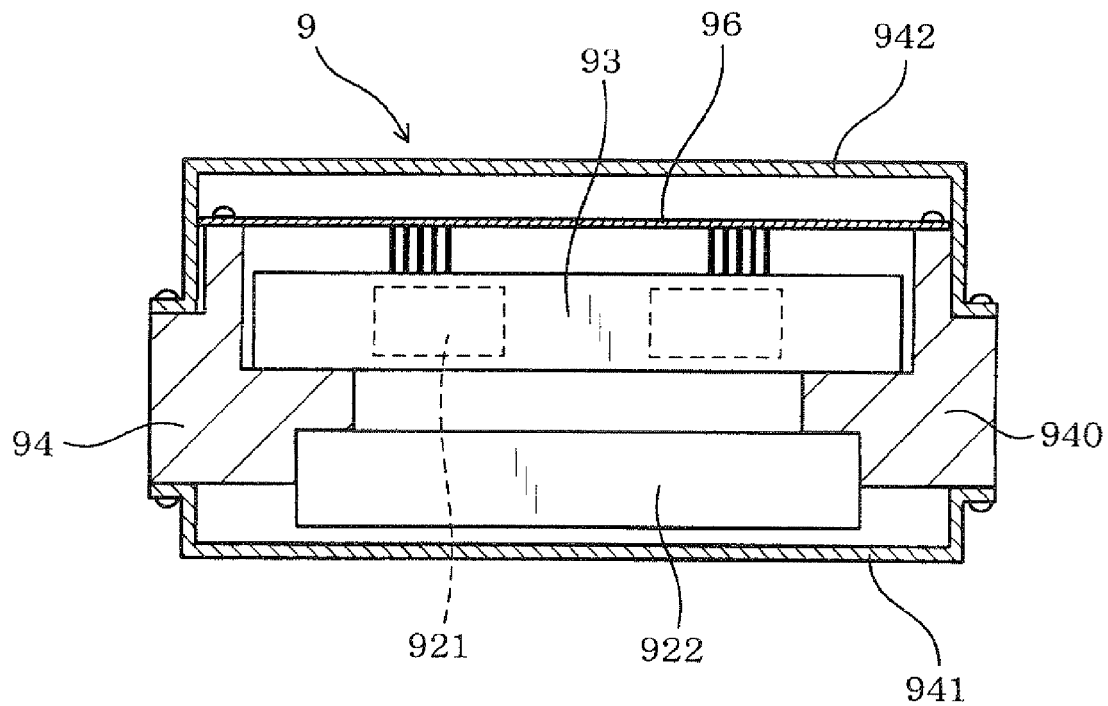
FIG. 27 is a cross sectional view of a conventional power conversion apparatus.

The wire holding section 59 has a hook-like shape as viewed from the height direction Z in FIGS. 21, 23, 25 and 26, and extends in the height direction Z, as shown in FIGS. 20, 22 and 24. The wire holding section 59 is formed in the front wall section 52 of the frame 5 so as to project outward therefrom. As shown in FIGS. 21 and 23, a part of the conductive wire 15 is fitted in the space between the wire holding section 59 and the front wall section 52.

The bus bar assembly 72 is, as shown in FIGS. 20 to 23, formed with a forward projecting section 721 projecting forward in the stacking direction X. The forward projecting section 721 is located in a position opposite to the open side of the wire holding section 59, as viewed from the height direction Z. The forward projecting section 721 serves to prevent the conductive wire 15 from coming off the wire holding section 59. The wire holding section 59 is located at nearly the same position in the lateral direction Y as a connector section 151 of the conductive wire 15 for connection with the control circuit board 6. The components of this embodiment are the same as those of the first embodiment except for the above.

In the second embodiment, the conductive wire 15 is laid along the frame 5, thus preventing the internal unit 10 from being caught by the conductive wire 15 when it is put in or taken out of the case 4. Other than the above, the second embodiments provides the same advantages as those provided by the first embodiment.

The wire holding section 59 may alternatively be made to hold a wire(s) instead of the conductive wire 15 provided for making a connection between the capacitor 22 and the control circuit board 6. The wire holding section 59 may be formed in a shape and a position different from those described above, so that the conductive wire 15 may be laid along the lateral direction Y. The wire holding section 59 may be formed in two or more positions in the frame 5.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

The cooler 3 is, as described above, formed by a stack of the cooling tubes 31 and the semiconductor modules 21, but however, may alternatively be made to have another structure in which semiconductor modules and coolant passages are stacked alternately. For instance, the cooler 3 may be made of a stack of semiconductor module-cooler encapsulators each of which hermetically encapsulates a semiconductor device (s) and a metallic member(s) which is connected thermally to the semiconductor device to dissipate heat, as generated by the semiconductor device. Each of the semiconductor module-cooler encapsulators is so shaped as to define therein a coolant passage through which coolant flows and to which the metallic member is exposed.

The pressure member 12 may alternatively be disposed between the front end of the stacked body 11 and the front wall section 52. The pressure member 12 may also be interposed between the front end of the stacked body 11 and the front wall section 52 and between the coolant introduction tube 331 and the coolant discharge tube 331 which extend parallel to each other.

What is claimed is:

1. A power conversion apparatus, comprising:
electronic components constituting a power conversion circuit;
a cooler which works to cool at least a portion of the electronic components;
an internal unit having a frame to which the at least a portion of the electronic components and the cooler are secured and which surrounds the at least a portion of the electronic components;
a case in and to which the internal unit is disposed and fixed through the frame; and;
a capacitor that is one of the electronic components and with which the internal unit is equipped,
wherein the frame includes unit fixing sections through which the internal unit is fixed to the case and capacitor fixing sections through which the capacitor is fixed to the internal unit,
wherein the capacitor fixing sections are located inward of the frame more than the unit fixing sections, wherein the internal unit has a plurality of semiconductor modules disposed inside the frame as ones of the electronic components, the semiconductor modules having switching elements installed therein, wherein the semiconductor modules are equipped with a main electrode terminal into or from which controlled electric power is inputted or outputted and which protrudes toward the capacitor, and wherein the capacitor fixing sections protrude from the frame toward the capacitor to have a top end located farther away from the frame than a top end of the main electrode terminal.

2. A power conversion apparatus as set forth in claim 1, wherein the internal unit incorporates therein a stacked body in which coolant passages and the semiconductor modules are stacked alternately, and wherein the frame includes a front wall section and a rear wall section which are located on sides of the frame in a stacking direction in which the coolant passages and the semiconductor modules are stacked and a pair of side wall sections joining the front and rear wall sections at ends thereof.

3. A power conversion apparatus as set forth in claim 2, wherein the internal unit is equipped with bus bars which have input/output terminals into or from which controlled electric power is input or outputted, the input/output terminals extending perpendicular to the side wall sections, and wherein the capacitor fixing sections are located in the stacking direction outward of two of side surfaces of the capacitor which extend in parallel to each other and perpendicular to the stacking direction.

4. A power conversion apparatus as set forth in claim 2, wherein the internal unit is equipped with a pressure member which presses the stacked body in the stacking direction, the stacked body having a front end and a rear end which are opposite each other in the stacking direction, the pressure member being disposed between the rear end of the stacked body and the rear wall section, the front end of the stacked body being supported by the front wall section and having a coolant introduction tube through which coolant is introduced into the coolant passages and a coolant discharge tube from which the coolant is discharged from the coolant passages, wherein the front wall section has formed therein recesses in which the coolant introduction tube and the coolant discharge tube are placed, wherein the capacitor fixing sections protrude from the frame toward the capacitor and overlap at least partially with the recesses as viewed from a direction in which the capacitor fixing sections protrude.

5. A power conversion apparatus as set forth in claim 2, wherein the cooler includes a plurality of cooling tubes each of which defines one of the coolant passages therein.

* * * * *